(12) United States Patent
Ota et al.

(10) Patent No.: US 10,586,695 B2
(45) Date of Patent: Mar. 10, 2020

(54) SUBSTRATE PROCESSING METHOD AND SUBSTRATE PROCESSING DEVICE

(71) Applicant: SCREEN Holdings Co., Ltd., Kyoto (JP)

(72) Inventors: Takashi Ota, Kyoto (JP); Taiki Hinode, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 15/548,183

(22) PCT Filed: Dec. 28, 2015

(86) PCT No.: PCT/JP2015/086540
§ 371 (c)(1),
(2) Date: Aug. 2, 2017

(87) PCT Pub. No.: WO2016/125421
PCT Pub. Date: Aug. 11, 2016

(65) Prior Publication Data
US 2018/0033605 A1 Feb. 1, 2018

(30) Foreign Application Priority Data
Feb. 5, 2015 (JP) .................... 2015-021525

(51) Int. Cl.
*H01L 21/02* (2006.01)
*H01L 21/67* (2006.01)

(52) U.S. Cl.
CPC .... *H01L 21/0206* (2013.01); *H01L 21/02063* (2013.01); *H01L 21/02071* (2013.01);
(Continued)

(58) Field of Classification Search
CPC ........... H01L 21/0206; H01L 21/02321; H01L 21/675051; H01L 21/67103
See application file for complete search history.

(56) References Cited

U.S. PATENT DOCUMENTS

2003/0129539 A1* 7/2003 Tsai .................. G03F 7/094
430/311
2006/0003603 A1* 1/2006 Fukuchi ............ H01J 37/32192
438/787
(Continued)

FOREIGN PATENT DOCUMENTS

| CN | 101834148 A | 9/2010 |
|---|---|---|
| JP | 2004-281463 A | 10/2004 |

(Continued)

OTHER PUBLICATIONS

International Search Report dated Mar. 29, 2016 in corresponding PCT International Application No. PCT/JP2015/086540.
(Continued)

*Primary Examiner* — Dah-Wei D. Yuan
*Assistant Examiner* — Kristen A Dagenais-Englehart
(74) *Attorney, Agent, or Firm* — Ostrolenk Faber LLP

(57) ABSTRACT

Method for performing cleaning treatment on a substrate having a fine pattern provided with a film formed on the surface, comprises: a silylating step of supplying a silylating agent to the surface of the substrate and silylating the surface of the substrate; and a liquid-chemical cleaning step of supplying a cleaning liquid chemical to the surface of the substrate and cleaning the surface of the substrate after, or simultaneously with, the silylating step.

9 Claims, 20 Drawing Sheets

(52) U.S. Cl.
CPC .. *H01L 21/02321* (2013.01); *H01L 21/67028* (2013.01); *H01L 21/67051* (2013.01); *H01L 21/67103* (2013.01); *H01L 21/0217* (2013.01); *H01L 21/02274* (2013.01); *H01L 21/67167* (2013.01)

(56) References Cited

U.S. PATENT DOCUMENTS

| | | | | |
|---|---|---|---|---|
| 2007/0082491 | A1* | 4/2007 | Uozumi | H01L 21/02063 438/692 |
| 2009/0209059 | A1* | 8/2009 | Isaka | H01L 31/022425 438/74 |
| 2010/0233856 | A1 | 9/2010 | Nogi et al. | 438/114 |
| 2011/0195190 | A1* | 8/2011 | Koshiyama | C09K 3/18 427/284 |
| 2011/0244680 | A1 | 10/2011 | Tohnoe et al. | 438/677 |
| 2011/0269313 | A1* | 11/2011 | Ogawa | H01L 21/0206 438/694 |
| 2012/0164339 | A1 | 6/2012 | Nakamori et al. | 427/401 |
| 2013/0078776 | A1* | 3/2013 | Kim | H01L 21/3105 438/268 |
| 2014/0065295 | A1* | 3/2014 | Emoto | B05D 1/005 427/8 |

FOREIGN PATENT DOCUMENTS

| | | |
|---|---|---|
| JP | 2007-134690 A | 5/2007 |
| JP | 2010-045254 A | 2/2010 |
| JP | 2010-129932 A | 6/2010 |
| JP | 2011-233774 A | 11/2011 |
| JP | 2012-138482 A | 7/2012 |
| JP | 2014-197571 A | 10/2014 |
| JP | 2014-197638 A | 10/2014 |
| KR | 10-2013-0065647 A | 6/2013 |

OTHER PUBLICATIONS

Written Opinion dated Mar. 29, 2016 in corresponding PCT International Application No. PCT/JP2015/086540.
The International Preliminary Report on Patentability (Chapter I) dated Aug. 17, 2017 and the Notification from the International Bureau (Form PCT/IB/326) in corresponding PCT International Application No. PCT/JP2015/086540 in Japanese.
English translation of the International Preliminary Report on Patentability (Chapter I) dated Aug. 17, 2017 with Notification from the International Bureau (Form PCT/IB/338) in corresponding PCT International Application No. PCT/JP2015/086540 in English.

\* cited by examiner

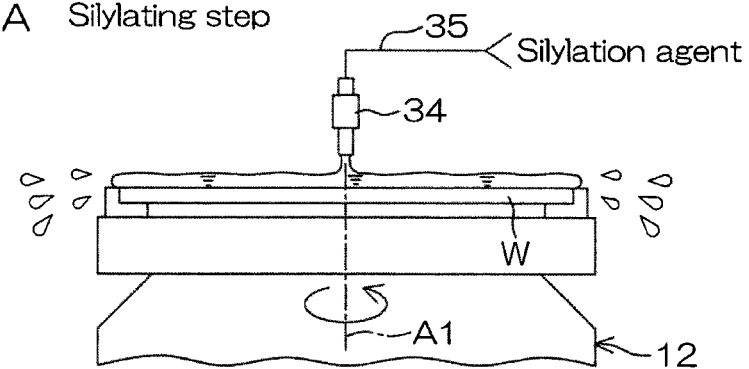
FIG. 5A Silylating step
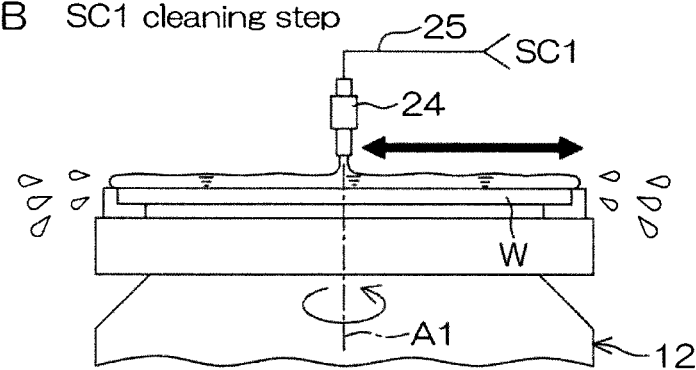
FIG. 5B SC1 cleaning step
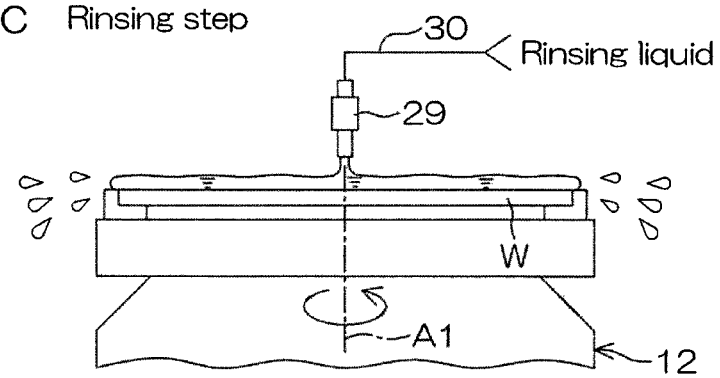
FIG. 5C Rinsing step
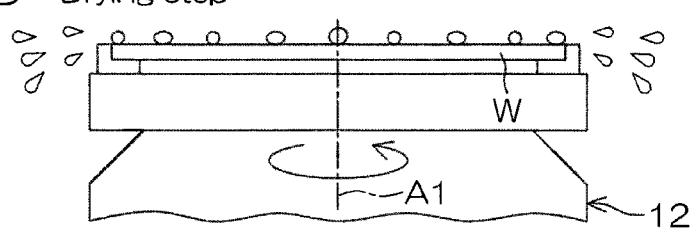
FIG. 5D Drying step

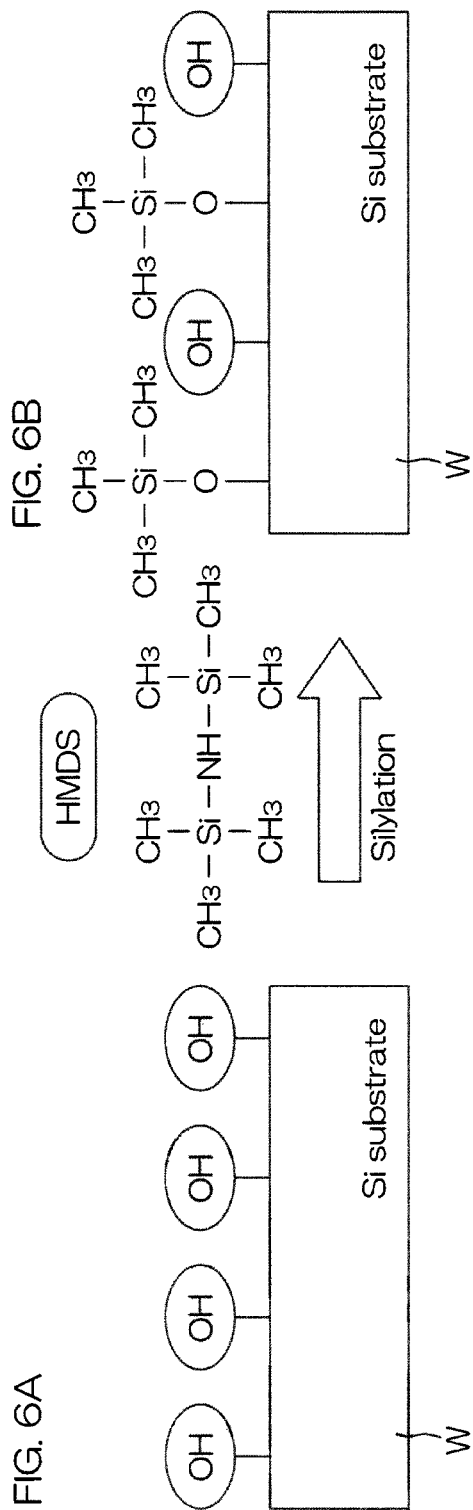

Silylating step

With hot plate 413 in heat generating state

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2015/086540, filed Dec. 28, 2015, which claims priority to Japanese Patent Application No. 2015-021525, filed Feb. 5, 2015, the contents of both of which are incorporated herein by reference. The PCT International Application was published in the Japanese language.

TECHNICAL FIELD

The present invention relates to a substrate processing method and a substrate processing apparatus for cleansing a surface of a substrate using a cleaning chemical liquid. A substrate to be processed includes semiconductor wafer.

BACKGROUND ART

In a manufacturing process of a semiconductor device, a cleaning treatment of supplying a cleaning chemical liquid to a surface of a semiconductor wafer to remove an unwanted matter from a surface of its substrate.

A single-substrate-processing apparatus processing semiconductor wafers one by one comprises a spin chuck rotating a substrate while holding the substrate horizontally, and a nozzle supplying a cleaning chemical liquid to a surface of the substrate held by the spin chuck. The cleaning chemical liquid is supplied to the surface of the substrate while the spin chuck which holds the substrate is being rotated. Thus, the cleaning chemical liquid reaches an entire area of the surface of the substrate to remove an unwanted matter from the entire area of the surface of the substrate.

PRIOR ART DOCUMENT

Patent Document
Patent document 1: Japanese Unexamined Patent Publication No. 2004-281463

SUMMARY OF THE INVENTION

Subject to be Solved by the Invention

A pattern including a film such as an oxide film and a nitride film is sometimes formed on a surface of a substrate subjected to such cleaning treatment. During the cleaning treatment, a film loss (film reduction) may occur on a film included in the surface of the substrate due to supply of a cleaning chemical liquid to the surface of the substrate. Depending on a type of the cleaning chemical liquid and a type of the film, removal of the film may progress rapidly, so that the film loss may increase.

An allowable range of a film loss narrows along with miniaturization of a pattern in recent years, and a possibility that a film loss influences a transistor characteristic of a semiconductor has become obvious. Thus, it is required to try to reduce or prevent a loss of a film along with a cleaning treatment particularly in a cleaning treatment of a substrate having a fine pattern.

Therefore, an object of the present invention is to provide a substrate processing method and a substrate processing apparatus which can cleanse a surface of a substrate having a fine pattern while trying to reduce or prevent a loss of a film included in the fine pattern.

Solution to Solve the Problem

This invention provides a substrate processing method of performing a cleaning treatment to a substrate having a fine pattern including a film on a surface of the substrate, including: a silylating step of supplying a silylation agent to the surface of the substrate; and a chemical liquid cleaning step of cleaning the surface of the substrate by supplying a cleaning chemical liquid to the surface of the substrate after the silylating step or in parallel with the silylating step.

According to this method, the silylating step is performed prior to the chemical liquid cleaning step or in parallel with this chemical liquid cleaning step. In the silylating step, a surface layer of the film included in the surface of the substrate is silylated (reformed) by the silylation agent, and this film is covered by a protective layer. Therefore, the chemical liquid cleaning step can be performed in a state where the film is covered by the protective layer. Accordingly, a loss of the film is difficult to occur in the chemical liquid cleaning step. Thus, the surface of the substrate having the fine pattern can be cleaned while trying to reduce or prevent the loss of the film included in the fine pattern.

In one embodiment of this invention, the silylating step includes a step of supplying a liquid silylation agent to the surface of the substrate.

According to this method, the silylating step using the liquid silylation agent and the chemical liquid step using the cleaning chemical liquid can be performed using a common device. In this case, it is not required to transfer the substrate in the middle of a series of treatments to the substrate, whereby this series of treatments can be performed in a short time.

The chemical liquid cleaning step may include a latter supplying step of supplying the cleaning chemical liquid to the surface of the substrate after the silylating step. According to this method, the silylating step is performed prior to the chemical liquid cleaning step. That is, after the film is covered by the protective layer, the cleaning chemical liquid is started to be supplied to the surface of the substrate. Thus, the loss of the film along with the cleaning of the surface of the substrate using the cleaning chemical liquid can be even more reduced or prevented.

The chemical liquid cleaning step may include a parallel supplying step of supplying the cleaning chemical liquid to the surface of the substrate in parallel with the silylating step. According to this method, the silylating step is performed in parallel with the chemical liquid cleaning step. That is, the film is covered by the protective layer in parallel with the supply of the cleaning chemical liquid to the surface of the substrate. Thus, the loss of the film can be reduced or prevented. Further, since the chemical liquid cleaning step and the silylating step are performed concurrently, a treatment time is shorter compared to a case where these two steps are performed in sequence. Thus, the loss of the film along with the cleaning of the surface of the substrate using the cleaning chemical liquid can be reduced or prevented while an entire treatment time is shortened.

In this case, an ammonia-hydrogen peroxide mixture may be used as the cleaning chemical liquid. Even when the silylation agent and the ammonia-hydrogen peroxide mixture contaminate, a severe reaction does not occur, and thus, a specific problem does not occur. Therefore, even when the supply of the silylation agent to the surface of the substrate and the supply of the ammonia-hydrogen peroxide mixture to the surface of the substrate are concurrently performed, there is not any concern that a severe reaction occurs along with contamination of them. Thus, an entire treatment time can be shortened without causing a severe reaction between the silylation agent and the cleaning chemical liquid.

The substrate processing method may further include a physical cleaning step of physically cleaning the surface of the substrate in parallel with the silylating step or prior to the silylating step.

According to this method, since the surface of the substrate is cleaned not only by the supply of the cleaning chemical liquid but also by the physical cleaning, the surface of the substrate can be cleaned even more favorably.

The substrate processing method may further include a substrate heating step of heating the substrate in parallel with the silylating step.

According to this method, the substrate is heated and the surface of the substrate is raised to a high temperature in parallel with the silylating step. Therefore, a reaction speed between the surface layer of the film provided on the substrate and silyl groups which the silylation agent has can be heightened. Therefore, a robust protective film can be formed on the surface layer of the film in the silylating step. Thus, the loss of the film along with the cleaning of the surface of the substrate using the cleaning chemical liquid can be even more reduced or prevented.

The substrate processing method may further include an oxide film forming step of forming an oxide film on the surface of the substrate prior to the silylating step.

According to this method, the oxide film forming step is performed prior to the silylating step. In this oxide film forming step, the oxide film is formed on the surface layer of the film included in the surface of the substrate.

Silyl groups which the silylation agent has are prone to react with hydroxyl groups (OH groups) included in the oxide film. Therefore, by covering the surface layer of the film included in the surface of the substrate W with the oxide film prior to the silylating step, the film included in the surface of the substrate W can be covered by a protective layer (silylated layer). Accordingly, silylation (reform) of the surface layer of the film included in the surface of the substrate W can be performed even more favorably in the silylating step, and thus, the loss of the film along with the cleaning of the surface of the substrate using the cleaning chemical liquid can be even more reduced or prevented.

The cleaning chemical liquid may include an ammonia-hydrogen peroxide mixture.

According to this method, the ammonia-hydrogen peroxide mixture is used as the cleaning chemical liquid. When the ammonia-hydrogen peroxide mixture is used as the cleaning chemical liquid, there is a concern that a loss may occur in the film included in the surface of the substrate. However, since the ammonia-hydrogen peroxide mixture is supplied in a state where the surface layer of the film is covered by a protective layer, the loss of the film in the chemical liquid cleaning step can be tried to be reduced or prevented.

When the ammonia-hydrogen peroxide mixture is used as the cleaning chemical liquid, there is a concern that roughness appears on the surface of the substrate (the surface of the fine pattern) along with the cleaning treatment.

However, since the ammonia-hydrogen peroxide mixture is supplied to the surface of the substrate in a state where the surface layer of the fine pattern of the substrate is covered by the protective layer, a substrate roughness on the surface of the substrate (the surface of the fine pattern) along with the supply of the ammonia-hydrogen peroxide mixture can be suppressed or prevented.

Further, the cleaning chemical liquid may include a sulfuric acid/hydrogen peroxide mixture.

According to this method, the sulfuric acid/hydrogen peroxide mixture is used as the cleaning chemical liquid. When the sulfuric acid/hydrogen peroxide mixture is used as the cleaning chemical liquid, there is a concern that a loss may occur in the film included in the surface of the substrate. However, since the sulfuric acid/hydrogen peroxide mixture is supplied in a state where the surface layer of the film is covered by a protective layer, the loss of the film in the chemical liquid cleaning step can be tried to be reduced or prevented.

The fine pattern may include an SiN film fabricated by a plasma CVD method.

According to this method, the SiN film fabricated by the plasma CVD method is relatively prone to be lost. Even when a fine pattern including such an SiN film is formed on the surface of the substrate, a loss of the SiN film can be effectively suppressed. Thus, the loss of the SiN film can be tried to be reduced or prevented at a time of being capable of cleaning the surface of the substrate using the cleaning chemical liquid.

This invention provides a substrate processing apparatus for performing a cleaning treatment to a substrate having a fine pattern including a film on a surface of the substrate, including: a silylation agent supplying unit for supplying a silylation agent to the surface of the substrate; a cleaning chemical liquid supplying unit for supplying a cleaning chemical liquid to the surface of the substrate; and a controller performing, through controlling the silylation agent supplying unit and the cleaning chemical liquid supplying unit, a silylating step of supplying the silylation agent to the surface of the substrate and a chemical liquid cleaning step of cleaning the surface of the substrate by supplying the cleaning chemical liquid to the surface of the substrate after the silylating step or in parallel with the silylating step.

According to this configuration, the silylating step is performed prior to the chemical liquid cleaning step or in parallel with this chemical liquid cleaning step. In the silylating step, a surface layer of the film included in the surface of the substrate is silylated (reformed) by the silylation agent, and this film is covered by a protective layer. Therefore, the chemical liquid cleaning step can be performed in a state where the film is covered by the protective layer. Accordingly, a loss of the film is difficult to occur in the chemical liquid cleaning step. Thus, the surface of the substrate having the fine pattern can be cleaned while trying to reduce or prevent the loss of the film included in the fine pattern.

In one embodiment of this invention, the silylating step includes a step of supplying a liquid silylation agent to the surface of the substrate.

According to this configuration, the silylating step using the liquid silylation agent and the chemical liquid step using the cleaning chemical liquid can be performed using a common device. In this case, it is not required to transfer the substrate in the middle of a series of treatments to the substrate, whereby this series of treatments can be performed in a short time.

The chemical liquid cleaning step may include a latter supplying step of supplying the cleaning chemical liquid to the surface of the substrate after the silylating step. According to this configuration, the silylating step is performed prior to the chemical liquid cleaning step. That is, after the film is covered by the protective layer, the cleaning chemical liquid is started to be supplied to the surface of the substrate. Thus, the loss of the film along with the cleaning of the surface of the substrate using the cleaning chemical liquid can be even more reduced or prevented.

The chemical liquid cleaning step may include a parallel supplying step of supplying the cleaning chemical liquid to the surface of the substrate in parallel with the silylating step. According to this configuration, the silylating step is performed in parallel with the chemical liquid cleaning step. That is, the film is covered by the protective layer in parallel with the supply of the cleaning chemical liquid to the surface of the substrate. Thus, the loss of the film can be reduced or prevented. Further, since the chemical liquid cleaning step and the silylating step are performed concurrently, a treatment time is shorter compared to a case where these two steps are performed in sequence. Thus, the loss of the film along with the cleaning of the surface of the substrate using the cleaning chemical liquid can be reduced or prevented while an entire treatment time is shortened.

In this case, an ammonia-hydrogen peroxide mixture may be used as the cleaning chemical liquid. Even when the silylation agent and the ammonia-hydrogen peroxide mixture contaminate, a severe reaction does not occur, and thus, a specific problem does not occur. Therefore, even when the supply of the silylation agent to the surface of the substrate and the supply of the ammonia-hydrogen peroxide mixture to the surface of the substrate are concurrently performed, there is not any concern that a severe reaction occurs along with contamination of them. Thus, an entire treatment time can be shortened without causing a severe reaction between the silylation agent and the cleaning chemical liquid.

The controller may perform a physical cleaning step of physically cleaning the surface of the substrate in parallel with the silylating step or prior to the silylating step.

According to this configuration, since the surface of the substrate is cleaned not only by the supply of the cleaning chemical liquid but also by the physical cleaning, the surface of the substrate can be cleaned even more favorably.

The controller may further perform a substrate heating step of heating the substrate in parallel with the silylating step.

According to this configuration, the substrate is heated and the surface of the substrate is raised to a high temperature in parallel with the silylating step. Therefore, a reaction speed between the surface layer of the film provided on the substrate and silyl groups which the silylation agent has can be heightened. Therefore, a robust protective film can be formed on the surface layer of the film in the silylating step. Thus, the loss of the film along with the cleaning of the surface of the substrate using the cleaning chemical liquid can be even more reduced or prevented.

The controller may further perform an oxide film forming step of forming an oxide film on the surface of the substrate prior to the silylating step.

According to this configuration, the oxide film forming step is performed prior to the silylating step. In this oxide film forming step, the oxide film is formed on the surface layer of the film included in the surface of the substrate.

Silyl groups which the silylation agent has are prone to react with hydroxyl groups (OH groups) included in the oxide film. Therefore, by covering the surface layer of the film included in the surface of the substrate W with the oxide film prior to the silylating step, the film included in the surface of the substrate W can be covered by a protective layer (silylated layer). Accordingly, silylation (reform) of the surface layer of the film included in the surface of the substrate W can be performed even more favorably in the silylating step, and thus, the loss of the film along with the cleaning of the surface of the substrate using the cleaning chemical liquid can be even more reduced or prevented.

The cleaning chemical liquid may include an ammonia-hydrogen peroxide mixture.

According to this configuration, the ammonia-hydrogen peroxide mixture is used as the cleaning chemical liquid. When the ammonia-hydrogen peroxide mixture is used as the cleaning chemical liquid, there is a concern that a loss may occur in the film included in the surface of the substrate. However, since the ammonia-hydrogen peroxide mixture is supplied in a state where the surface layer of the film is covered by a protective layer, the loss of the film in the chemical liquid cleaning step can be tried to be reduced or prevented.

When the ammonia-hydrogen peroxide mixture is used as the cleaning chemical liquid, there is a concern that roughness appears on the surface of the substrate (the surface of the fine pattern) along with the cleaning treatment.

However, since the ammonia-hydrogen peroxide mixture is supplied to the surface of the substrate in a state where the surface layer of the fine pattern of the substrate is covered by the protective layer, a substrate roughness on the surface of the substrate (the surface of the fine pattern) along with the supply of the ammonia-hydrogen peroxide mixture can be suppressed or prevented.

Further, the cleaning chemical liquid may include a sulfuric acid/hydrogen peroxide mixture.

According to this configuration, the sulfuric acid/hydrogen peroxide mixture is used as the cleaning chemical liquid. When the sulfuric acid/hydrogen peroxide mixture is used as the cleaning chemical liquid, there is a concern that a loss may occur in the film included in the surface of the substrate. However, since the sulfuric acid/hydrogen peroxide mixture is supplied in a state where the surface layer of the film is covered by a protective layer, the loss of the film in the chemical liquid cleaning step can be tried to be reduced or prevented.

The fine pattern may include an SiN film fabricated by a plasma CVD method.

The above-described or yet other objects, features and advantages of the present invention are revealed by the following embodiments described with reference to accompanied drawings.

BRIEF DESCRIPTION OF THE DRAWINGS

FIGS. 5A to 5D are illustrative views for describing the first cleaning treatment example.

FIG. 6A is a view showing a condition of a surface of a substrate before supplication of a liquid silylation agent. FIG. 6B is a view showing a condition of the surface of the substrate after supplication of the liquid silylation agent.

DESCRIPTION OF EMBODIMENTS

Figure 1:
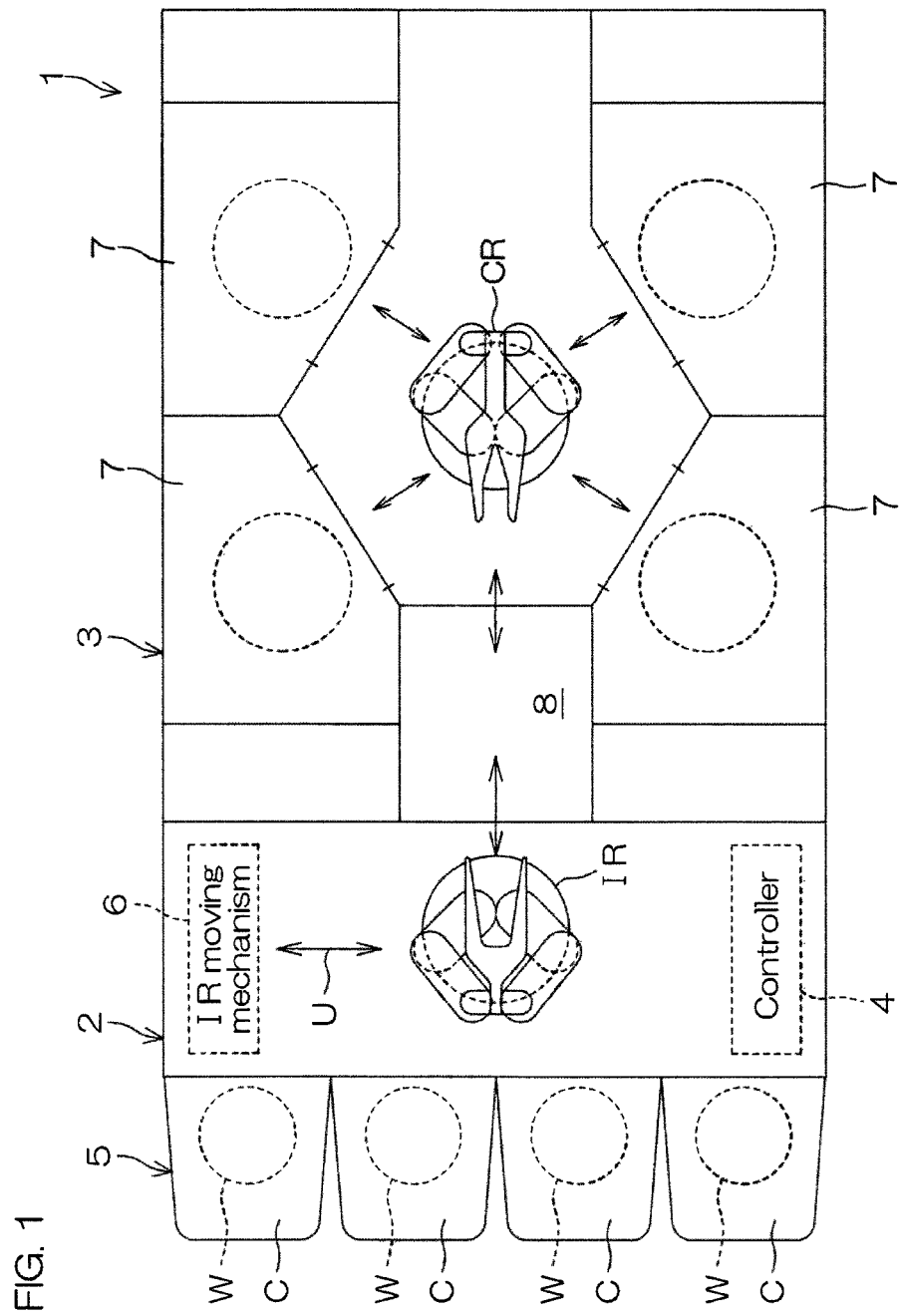
FIG. 1 is an illustrative plan view showing a layout of a substrate processing apparatus according to a first embodiment of the present invention.

FIG. 1 is an illustrative plan view showing a layout of a substrate processing apparatus 1 according to a first embodiment of the present invention.

The substrate processing apparatus 1 is a single-substrate-processing apparatus processing a circular substrate W such as a semiconductor wafer one by one. The substrate processing apparatus 1 cleans a surface (for example, a pattern forming surface on which a fine pattern is formed) of the substrate W using a cleaning chemical liquid. The substrate processing apparatus 1 comprises an indexer block 2, a process block 3 coupled to the indexer block 2, and a controller (controller) 4 controlling motion of devices and opening and closing of valves provided to the substrate processing apparatus 1.

The indexer block 2 comprises a carrier holding portion 5, an indexer robot IR and an IR moving mechanism 6. The carrier holding portion 5 holds a carrier C which can accommodate a plurality of substrates W. A plurality of carriers C are held by the carrier holding portion 5 in a state of being arranged in a horizontal carrier arrangement direction U. The IR moving mechanism 6 moves the indexer robot IR in the carrier arrangement direction U. The indexer robot IR performs carrying-in motion of carrying a substrate W into the carrier C held by the carrier holding portion 5 and carrying-out motion of carrying the substrate W out from the carrier C.

On the other hand, the process block 3 comprises a plurality of (for example, four or more) processing units 7 processing the substrate W and a center robot CR. The plurality of processing units 7 are disposed to surround the center robot CR in a plan view. The plurality of processing units 7 are, for example, processing units common to one another.

Figure 2:
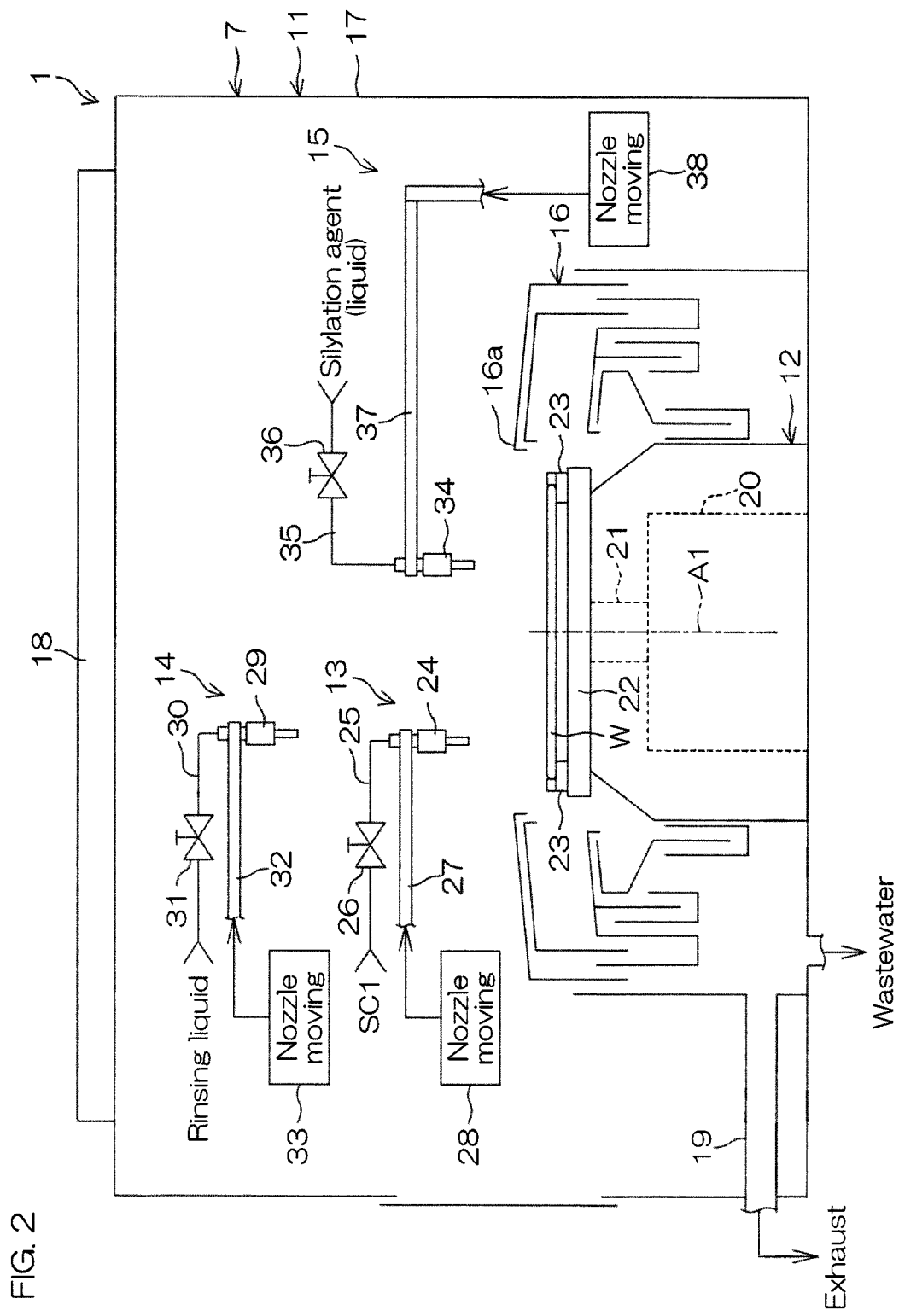
FIG. 2 is a view of a processing unit included in the substrate processing apparatus in a horizontal direction.

FIG. 2 is a view of the processing unit 7 in a horizontal direction. Each processing unit 7 performs a treatment (cleaning treatment) of removing a particle and the like from a surface of a substrate W by supplying SC1 (ammonia-hydrogen peroxide mixture) which is an example of an alkaline cleaning chemical liquid (cleaning chemical liquid) to the surface of the substrate W. Each processing unit 7 includes a box-shaped chamber 11 having an inner space, a spin chuck (substrate holding unit) 12 holding one substrate W in a horizontal posture in the chamber 11 and rotating the substrate W around a perpendicular rotation axis A1 passing a center of the substrate W, an SC1 supplying unit (cleaning chemical liquid supplying unit) 13 supplying SC1 to an upper surface (surface) of the substrate W held by the spin chuck 12, a rinsing liquid supplying unit 14 for supplying a rinsing liquid to the upper surface of the substrate W held by the spin chuck 12, a first silylation agent supplying unit (silylation agent supplying unit) 15 for supplying a liquid-type silylation agent to the upper surface of the substrate W held by the spin chuck 12, and a tube-shaped cup 16 surrounding a vicinity of the spin chuck 12.

The chamber 11 includes a box-shaped partition wall 17 accommodating the spin chuck 12 and a nozzle, an FFU (fan filter unit) 18 as a blowing unit sending clean air (air filtrated by a filter) from an upper portion of the partition wall 17 into the partition wall 17, and an exhaust duct 19 draining air in the chamber from a lower portion of the partition wall 17. The FFU 18 is disposed above the partition wall 17 and is attached to a ceiling of the partition wall 17. The FFU 18 send clean air downward from the ceiling of the partition wall 17 into the chamber 11. The exhaust duct 19 is connected to a bottom portion of the cup 16 and guides air in the chamber 11 toward an exhaust treatment installation provided in a factory where the substrate processing apparatus 1 is installed. Therefore, the FFU 18 and the exhaust duct 19 form a downflow flowing downward in the chamber 11. Processing of the substrate W is performed in a state where a downflow is formed in the chamber 11.

A clamping-type chuck clamping a substrate W in the horizontal direction to hold the substrate W horizontally is employed as the spin chuck 12. Specifically, the spin chuck 12 includes a spin motor 20, a spin shaft 21 integrated with a drive shaft of this spin motor 20, and a disk-shaped spin base 22 attached generally horizontally to an upper end of the spin shaft 21.

A plurality of (three or more; for example, six) clamping members 23 are disposed on a peripheral portion of an upper surface of the spin base 22. The plurality of clamping members 23 are disposed at appropriate intervals on a circumference corresponding to an outer peripheral shape of the substrate W in an upper surface peripheral portion of the spin base 22.

Further, the spin chuck 12 is not limited to a clamping type, but for example, a vacuum suction type (vacuum chuck) which holds the substrate W in a horizontal posture by vacuum-suctioning a rear surface of the substrate W and further rotates the substrate W about the perpendicular rotation axis in this state to rotate the substrate W held by the spin chuck 12 may be employed.

The SC1 supplying unit 13 includes an SC1 nozzle 24 discharging SC1, first SC1 piping 25 connected to the SC1 nozzle 24, a first SC1 valve 26 interposed in the first SC1 piping 25, a first nozzle arm 27 to whose tip end portion the SC1 nozzle 24 is attached, and a first nozzle moving unit 28 moving the SC1 nozzle 24 by swinging the first nozzle arm 27.

When the first SC1 valve 26 is opened, SC1 supplied from the first SC1 piping 25 to the SC1 nozzle 24 is discharged downward from the SC1 nozzle 24. When the first SC1 valve 26 is closed, discharge of SC1 from the SC1 nozzle 24 is stopped. The first nozzle moving unit 28 moves the SC1 nozzle 24 between a treatment position where SC1 discharged from the SC1 nozzle 24 is supplied to the upper surface of the substrate W and a retreat position where the SC1 nozzle 24 has retreated to a lateral side of the spin chuck 12 in a plan view. Further, the first nozzle moving unit 28 moves a supply position of SC1 within the upper surface of the substrate W by moving the SC1 nozzle 24 along the upper surface of the substrate W.

The rinsing liquid supplying unit 14 includes a rinsing liquid nozzle 29 discharging a rinsing liquid, rinsing liquid piping 30 connected to the rinsing liquid nozzle 29, a rinsing liquid valve 31 interposed in the rinsing liquid piping 30, a second nozzle arm 32 to whose tip end portion the rinsing liquid nozzle 29 is attached, and a second nozzle moving unit 33 moving the rinsing liquid nozzle 29 by swinging the second nozzle arm 32. The second nozzle moving unit 33 moves the rinsing liquid nozzle 29 between a treatment position where water discharged from the rinsing liquid nozzle 29 is supplied to the center portion of the upper surface of the substrate W and a retreat position where the rinsing liquid nozzle 29 has retreated to the lateral side of the spin chuck 12 in a plan view.

When the rinsing liquid valve 31 is opened, the rinsing liquid supplied from the rinsing liquid piping 30 to the rinsing liquid nozzle 29 is discharged from the rinsing liquid nozzle 29 toward an upper surface center portion of the substrate W. The rinsing liquid is, for example, pure water (Deionized Water). The rinsing liquid is not limited to pure water but may be any of carbonated water, electrolytic ion water, hydrogen water, ozone water, and hydrochloric acid water at a dilute concentration (for example, about 10 to 100 ppm).

The first silylation agent supplying unit 15 includes a silylation agent nozzle 34 discharging a liquid-type silylation agent (silane coupling agent), silylation agent piping 35 connected to the silylation agent nozzle 34, a silylation agent valve 36 interposed in the silylation agent piping 35, a third nozzle arm 37 to whose tip end portion the silylation agent nozzle 34 is attached, and a third nozzle moving unit 38 moving the silylation agent nozzle 34 by swinging the third nozzle arm 37.

The silylation agent discharged from the silylation agent nozzle 34 is an organosilicon compound whose molecule has at one end an ethoxy (or methoxy) group providing a silanol group (Si—OH) by hydrolysis and has at the other end an organic functional group such as an amino group and an glycidyl group. HMDS (hexamethyldisilazane) and TMS (tetramethylsilane) can be mentioned to as examples of the silylation agent.

When the silylation agent valve 36 is opened, the liquid silylation agent supplied from the silylation agent piping 35 to the silylation agent nozzle 34 is discharged downward from the silylation agent nozzle 34. When the silylation agent valve 36 is closed, discharge of the silylation agent from the silylation agent nozzle 34 is stopped. The third nozzle moving unit 38 moves the silylation agent nozzle 34 between a treatment position where the silylation agent discharged from the silylation agent nozzle 34 is supplied to the upper surface center portion of the substrate W and a retreat position where the silylation agent nozzle 34 has retreated to the lateral side of the spin chuck 12 in a plan view.

The cup 16 is disposed more outward (direction away from the rotation axis A1) than the substrate W held by the spin chuck 12. The cup 16 surrounds the spin base 22. When a processing liquid is supplied to the substrate W while the spin chuck 12 is rotating the substrate W, the processing liquid supplied to the substrate W is flicked off to a vicinity of the substrate W. When the processing liquid is supplied to the substrate W, an upper end portion 16a of the cup 16 which opens upward is disposed higher than the spin base 22. Therefore, the processing liquid drained to the vicinity of the substrate W is received by the cup 16. Then the processing liquid received by the cup 16 is then sent to a recovery device or wastewater device not shown.

The controller 4 is configured using a microcomputer, for example. The spin motor 20, the first nozzle moving unit 28, the second nozzle moving unit 33, the third nozzle moving unit 38, the first SC1 valve 26, the rinsing liquid valve 31, the silylation agent valve 36 and the like are connected to the controller 4 as objects to be controlled. The controller 4 controls motion of the spin motor 20, the first nozzle moving unit 28, the second nozzle moving unit 33, the third nozzle moving unit 38 and the like according to a predetermined program. Further, the controller 4 controls opening and closing motion and the like of the first SC1 valve 26, the rinsing liquid valve 31, the silylation agent valve 36 and the like.

Figure 3:
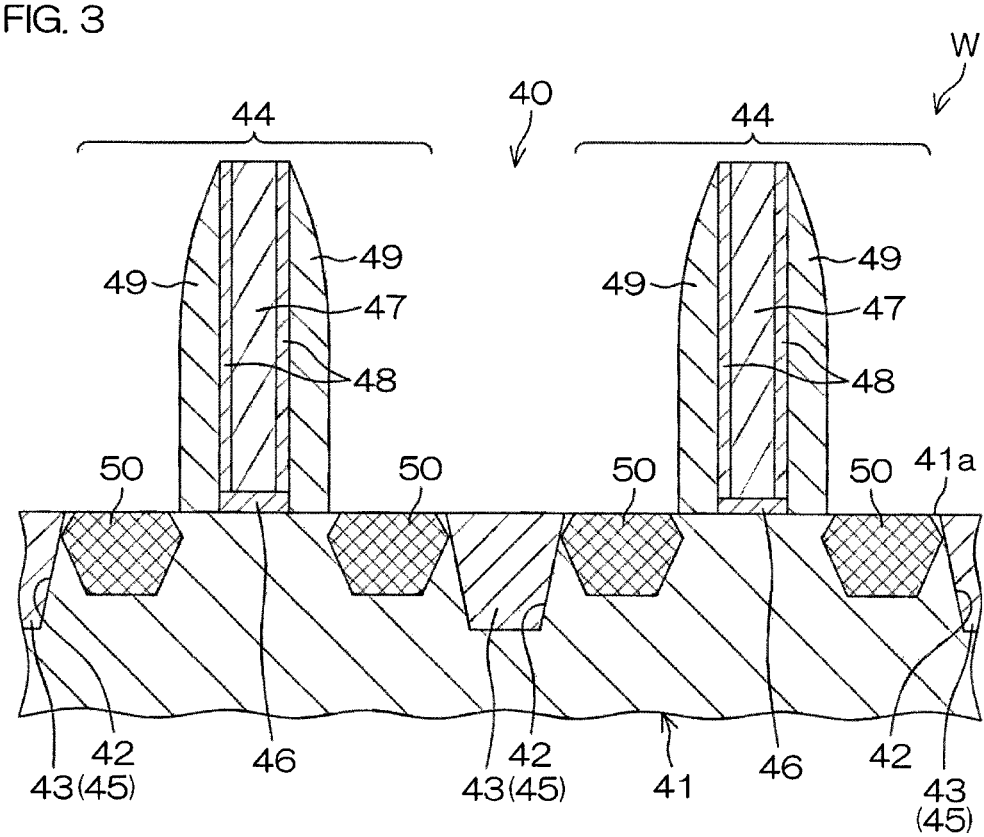
FIG. 3 is a sectional view showing a surface of a substrate to be processed in an enlarged manner.

FIG. 3 is a sectional view showing the surface of the substrate W to be processed in an enlarged manner.

The substrate W to be processed serves as a base of MOSFET and FINFIT, for example, and includes a silicon substrate 41. A fine pattern 40 of a nanoscale is formed on a surface of the silicon substrate 41. The fine pattern 40 is described below.

Specifically, a trench 42 is formed on a surface layer portion of the silicon substrate 41 by digging down its surface. A plurality of trenches 42 are formed at regular intervals in a right and left direction of FIG. 3 and extend respectively in a direction orthogonal to a plane of paper of FIG. 3. A first $SiO_2$ film 43 is embedded in each trench 42. The first $SiO_2$ film 43 forms an element separating portion 45 insulating an element forming region 44 from regions other than this. A surface of the first $SiO_2$ film 43 is substantially flush with a surface 41a of the silicon substrate 41.

A second $SiO_2$ film 46 is formed on each element forming region 44. The second $SiO_2$ film 46 comprises a TEOS film (Tetraethyl orthosilicate), for example. A polysilicon film 47 functioning as a gate electrode is disposed on a surface of the second $SiO_2$ film 46. On the second $SiO_2$ film 46, both side surfaces of the polysilicon film 47 are covered by a third $SiO_2$ film 48 functioning as an offset spacer. The third $SiO_2$ film 48 is configured from a thermally oxidized film, for example. SiN films 49 functioning as side walls (side wall films) on both lateral sides of the polysilicon film 47 with the third $SiO_2$ film 48 sandwiched. The SiN film 49 is formed by a plasma CVD method, for example.

In each element forming region 44, SiGe films 50 are respectively embedded on both lateral sides of an arrangement position of the polysilicon film 47. Each of the SiGe films 50 extends in the direction orthogonal to the plane of paper of FIG. 3. A surface of the SiGe film 50 is substantially flush with the surface 41a of the silicon substrate 41.

Figure 4:
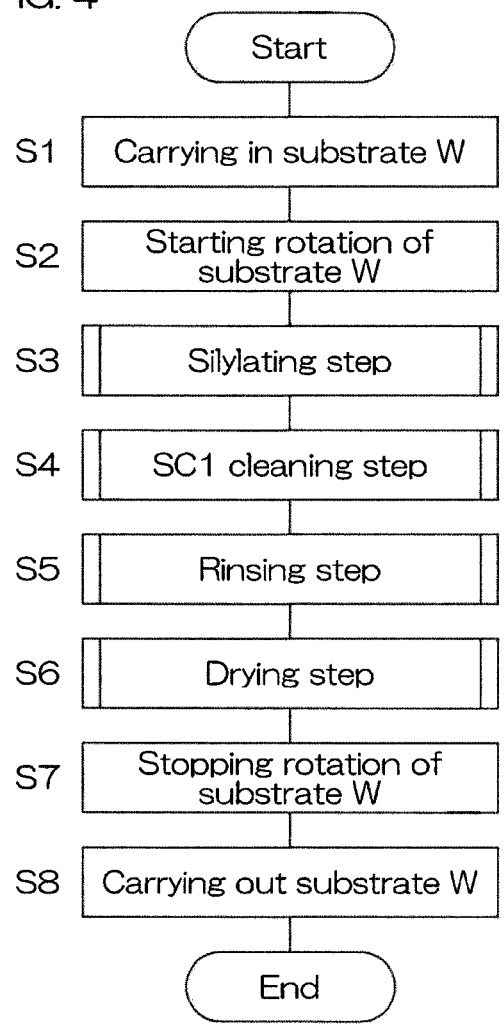
FIG. 4 is a flowchart for describing a first cleaning treatment example performed by the processing unit.
Figure 7A:
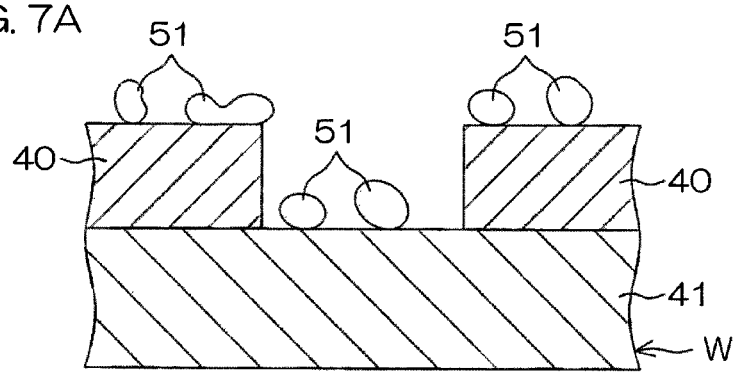
FIGS. 7A to 7B are illustrative views for describing a cleaning treatment performed in a SC1 cleaning step.
Figure 7B:
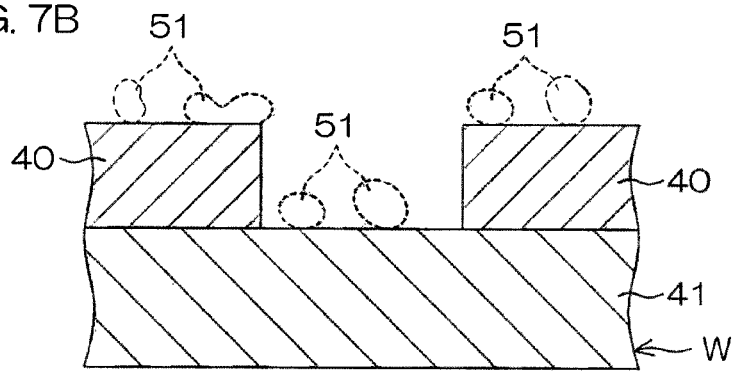
Figure 8A:
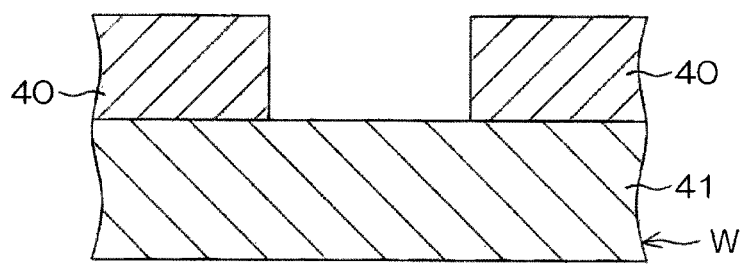
FIGS. 8A to 8B are illustrative views for describing an etching treatment as a comparison of cleaning treatments.
Figure 8B:
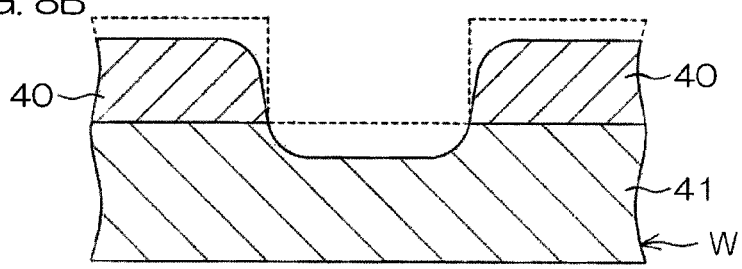

FIG. 4 is a flowchart for describing a first cleaning treatment example performed by the processing unit 7. FIG. 5A to FIG. 5D are illustrative views for describing the first cleaning treatment example. FIG. 6 are views showing silylation of a surface of a substrate W. FIG. 7 are illustrative views for describing a cleaning treatment performed in a SC1 cleaning step (S4). FIG. 8 are illustrative views for describing an etching treatment as a comparison of cleaning treatments.

An example where the surface (pattern forming surface) of the substrate W shown in FIG. 3 is treated is described below. Mainly referring to FIGS. 2, 3 and 4, the first cleaning treatment example is described. FIGS. 5A to 5D and 6 are appropriately referred to.

When the substrate processing apparatus 1 processes the substrate W, the substrate W is brought into the chamber 11 (step S1). Specifically, while configurations in the chamber 11 such as the nozzles 24, 29, 34 and the like have retreated from above the spin chuck 12, the controller 4 makes a transport robot (not shown) carry the substrate W into the chamber 11. Then the controller 4 makes the transport robot place the substrate W on the spin chuck 12 with the surface (pattern forming surface) of the substrate W facing upward. Thereafter, the controller 4 rotates the spin motor 20 while the substrate W is held by the spin chuck 12. Thus, rotation of the substrate W is started (step S2). After the substrate W is placed on the spin chuck 12, the controller 4 retreat the transport robot from the chamber 11.

Next, as shown in FIG. 5A, the silylating step (step S3) of supplying a liquid silylation agent to the upper surface (surface) of the substrate W to silylate the upper surface of the substrate W is performed. Specifically, the controller 4 moves the silylation agent nozzle 34 from the retreat position to the treatment position by controlling the third nozzle moving unit 38. When the silylation agent nozzle 34 is disposed above the upper surface center portion of the substrate W, the controller 4 opens the silylation agent valve 36 to discharge the liquid silylation agent from the silylation agent nozzle 34 toward the upper surface center portion of the substrate W being rotated. The liquid silylation agent supplied to the upper surface center portion of the substrate W receives a centrifugal force due to the rotation of the substrate W and moves toward an upper surface outer peripheral portion of the substrate W. Thus, the liquid silylation agent reaches an entire area of the upper surface of the substrate W, and the entire area of the upper surface (surface) of the substrate W is silylated.

FIGS. 6A, 6B show conditions of the surface of the substrate W before and after the supply of the liquid silylation agent when HMDS is used as the silylation agent. As shown in FIG. 3 and FIGS. 6A, 6B, due to silylation of the surface of the substrate W, silanol groups (Si—OH) present on the surface 41a of the silicon substrate 41 and surface layers of the films 43, 47, 48, 49, 50 are displaced by trimethylsilyl groups (Si—(CH$_3$)$_3$). One trimethylsilyl group has three methyl groups (CH$_3$). Therefore, after the silylation of the surface of the substrate W, the surface 41a of the silicon substrate 41 and the surface layers of the films 43, 47, 48, 49, 50 are covered by an umbrella of methyl groups, whereby a protective layer having a chemical resistance to SC1 is formed on the surface layers of the films 43, 47, 48, 49, 50.

After a predetermined period has passed from start of the supply of the liquid silylation agent to the substrate W, the controller 4 closes the silylation agent valve 36 to stop the discharge of the liquid silylation agent from the silylation agent nozzle 34. Further, the controller 4 retreats the silylation agent nozzle 34 from above the spin chuck 12 by controlling the third nozzle moving unit 38.

Further, in the silylating step (S3), the controller 4 may move (between the upper surface center portion and the upper surface outer peripheral portion, for example) the supply position of the liquid silylation agent to the upper surface of the substrate W by controlling the third nozzle moving unit 38.

Next, as shown in FIG. 5B, an SC1 cleaning step (step S4; chemical liquid cleaning step; latter supplying step) where SC1 is supplied to the substrate W is performed. Specifically, the controller 4 moves the SC1 nozzle 24 from the retreat position to the treatment position by controlling the first nozzle moving unit 28. Thereafter, the controller 4 opens the first SC1 valve 26 to discharge SC1 from the SC1 nozzle 24 toward the upper surface of the substrate W being rotated. Further, the controller 4 moves the supply position of SC1 to the upper surface of the substrate W between the upper surface center portion and the upper surface outer peripheral portion while the substrate W is rotating. Thus, the supply position of SC1 passes the entire area of the upper surface of the substrate W, and the entire area of the upper surface of the substrate W is scanned. Therefore, SC1 discharged from the SC1 nozzle 24 is directly supplied to the entire area of the upper surface of the substrate W to subject the entire area of the upper surface of the substrate W evenly to a cleaning treatment. Thus, particles and the like are favorably removed from the upper surface of the substrate W.

An cleaning treatment is generally a treatment to remove impurities from a substrate. In the SC1 cleaning step (S4) according to this embodiment, impurities 51 (particles, minute impurities and the like) adhered to the surface of the substrate W (the surface of the silicon substrate 41 itself and a surface of the fine pattern 40) are removed from the surface of the substrate W by supplying SC1 to the surface of the substrate W, as shown in FIG. 7. This cleaning treatment is different from an etching treatment (wet etching) described next.

An etching treatment is generally a treatment to remove various materials of a semiconductor, an insulating body and a conductive body or films thereof. Wet etching of supplying an etching chemical liquid is a treatment for partially removing a material film from the substrate W. In this wet etching, the silicon substrate 41 itself and/or the fine pattern 40 on the silicon substrate 41 is/are worked (removed), as shown in FIG. 8. In this regard, the above-described cleaning treatment is significantly different from wet etching.

After a predetermined period has passed from start of the supply of SC1 to the substrate W, the controller 4 closes the first SC1 valve 26 to stop the discharge of SC1 from the SC1 nozzle 24. Further, the controller 4 retreats the SC1 nozzle 24 from above the spin chuck 12 by controlling the first nozzle moving unit 28. SiGe can be easily removed by reacting with SC1.

Therefore, in the SC1 cleaning step (S4) where SC1 is supplied to the upper surface of the substrate W, a loss may be caused in the SiGe film 50. One cause thereof is assumed that a germanium oxide produced on the surface of the SiGe film 50 by oxidation through hydrogen peroxide solution is dissolved in water. That is, oxidation of the surface of the SiGe film 50 and etching of the germanium oxide produced therethrough are progressed at a high speed, and film reduction of the SiGe film 50 is progressed at a high speed. Further, when an alkaline cleaning chemical liquid such as SC1 is used as a cleaning chemical liquid, the upper surface of the substrate W (an upper surface of the fine pattern 40)

may become rough (substrate roughness may be caused). Based on these reasons, the upper surface of the substrate W needs to be protected.

The fine pattern 40 is formed on the surface of the substrate W. Along with miniaturization and three-dimensionalization of such a pattern, an allowable range of film loss is narrowed. That is, even in the SC1 cleaning step where film loss has conventionally not been a problem, a possibility that film loss may influence a transistor characteristic of a semiconductor becomes obvious. In such a SC1 cleaning step ((S4); this is also true to a SC1 cleaning step (S14) and a silylation-agent-containing SC1 liquid drop discharging step (S23) described later) of a three-dimensional miniaturized pattern, it is required to try to reduce or prevent loss of the SiGe film 50 along with the SC1 cleaning.

However, since the SC1 cleaning step (S4) is performed in a state where the surface 41*a* of the silicon substrate 41 and the films 43, 47, 48, 49, 50 are covered by the protective layer (that is, a state where the SiGe film 50 is covered by the protective layer), loss of a film (in particular, loss of the SiGe film 50) is difficult to occur in the SC1 cleaning step (S4).

Further, along with the supply of SC1 to the upper surface of the substrate W, trimethylsilyl groups (Si—(CH$_3$)$_3$) present on the surface 41*a* of the silicon substrate 41 and the surface layers of the films 43, 47, 48, 49, 50 are displaced by silanol groups (Si—OH). Thus, the protective layers formed on the surface 41*a* of the silicon substrate 41 and the surface layers of the films 43, 47, 48, 49, 50 are washed away by SC1 which is a cleaning chemical liquid.

Next, as shown in FIG. 5C, a rinsing step (step S5) of supplying a rinsing liquid to the upper surface of the substrate W is performed. Specifically, the controller 4 moves the rinsing liquid nozzle 29 from the retreat position to the treatment position by controlling the second nozzle moving unit 33. Thereafter, the controller 4 opens the rinsing liquid valve 31 to discharge water from the rinsing liquid nozzle 29 toward the center portion of the upper surface of the substrate W being rotated. After a predetermined period has passed from start of the supply of the rinsing liquid to the substrate W, the controller 4 closes the rinsing liquid valve 31 to stop the discharge of the rinsing liquid from the rinsing liquid nozzle 29. Further, the controller 4 retreats the rinsing liquid nozzle 29 from above the spin chuck 12 by controlling the second nozzle moving unit 33.

Next, the controller 4 controls the spin motor 20 to accelerate a rotation speed of the substrate W to a flicking-off drying speed, as shown in FIG. 5D. Thus, the rinsing liquid adhered to the upper surface of the substrate W is flicked off to dry the substrate W (S6: drying step).

When the drying step (S6) has been performed for a predetermined period, the controller 4 controls the spin motor 20 to stop rotation of the spin chuck 12 (the rotation of the substrate W) (step S7). Thus, the cleaning treatment to the single substrate W is finished, and similar to when carrying in the substrate W, the controller 4 carries out the treated substrate W from the chamber 11 by the transport robot (step S8).

As described above, according to the first embodiment, the silylating step (S3) is performed prior to the SC1 cleaning step (S4). In the silylating step (S3), the surface 41*a* of the silicon substrate 41 and the surface layers of the films 43, 47, 48, 49, 50 are silylated (reformed) by the silylation agent, and the surface 41*a* of the silicon substrate 41 and the surface layers of the films 43, 47, 48, 49, 50 are covered by the protective layer. The SC1 cleaning step (S4) can be performed in the state where the surface 41*a* of the silicon substrate 41 and the surface layers of the films 43, 47, 48, 49, 50 are covered by the protective layer. Therefore, the loss of the SiGe film 50 is difficult to occur in the SC1 cleaning step (S4). Thus, the surface of the substrate W having the fine pattern 40 can be cleaned using SC1 while trying to reduce or prevent the loss of the SiGe film 50 included in the fine pattern 40.

Further, since SC1 is supplied to the surface of the substrate W in the state where the surface 41*a* of the silicon substrate 41 and the surface layers of the films 43, 47, 48, 49, 50 are covered by the protective layer, the roughness of the upper surface of the substrate W (the upper surface of the fine pattern 40) along with the supply of SC1 can be suppressed or prevented.

Further, since SC1 is started to be supplied to the upper surface of the substrate W in a state where the silylation agent remains on the upper surface of the substrate W, there may be a problem that the silylation agent (HMDS or TMS) contaminates SC1 at an initial time of the SC1 cleaning step (S4). However, even when the silylation agent (HMDS or TMS) contaminates SC1, a severe reaction does not occur. Therefore, even when the SC1 cleaning step (S4) is performed following the silylating step (S3), a severe reaction does not occur on the upper surface of the substrate W.

Further, the silylating step (S3) and the SC1 cleaning step (S4) are performed using the common processing unit 7. Therefore, it is not required to transfer the substrate W in the middle of a series of treatments to the substrate W, whereby this series of treatments can be performed in a short time.

Figure 9:
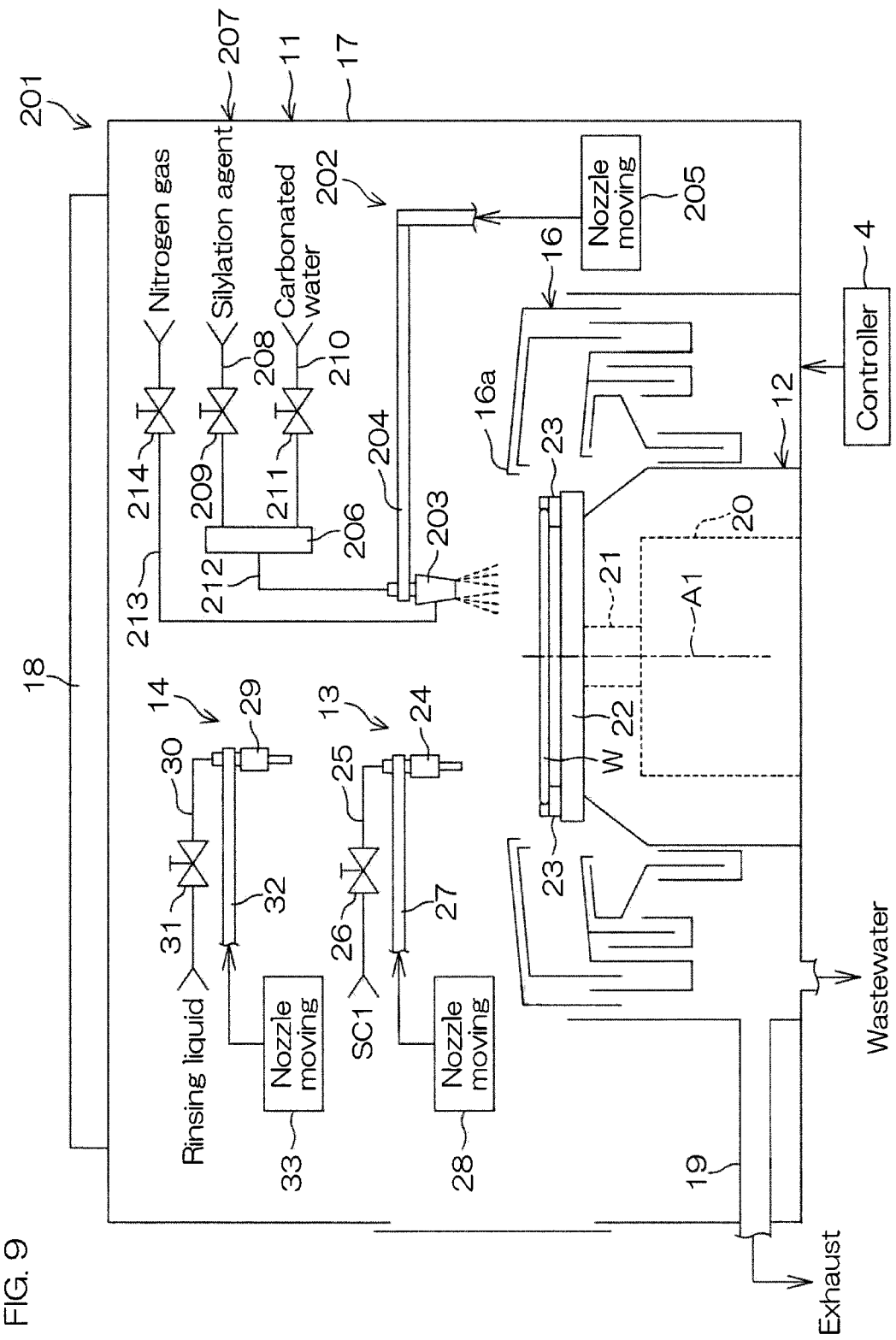
FIG. 9 is a view of a processing unit according to a second embodiment of the present invention in the horizontal direction.
Figure 10:
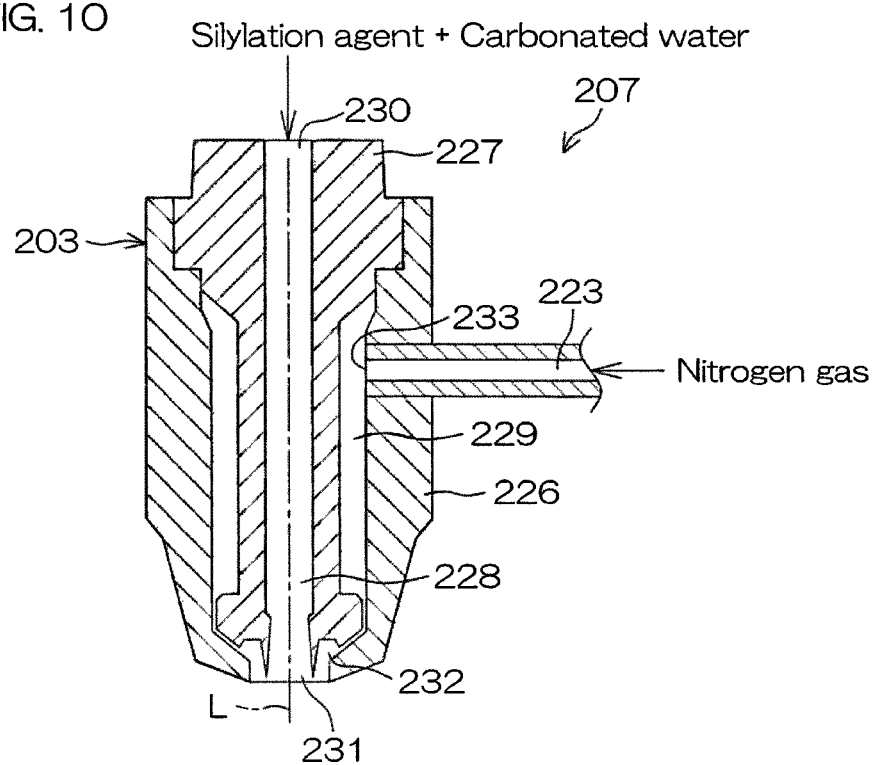
FIG. 10 is a sectional view illustratively showing a configuration of a two-fluid nozzle provided in the processing unit.

FIG. 9 is a view of a processing unit 207 according to a second embodiment of the present invention in the horizontal direction. FIG. 10 is a sectional view illustratively showing a configuration of a first two-fluid nozzle 203 provided in the processing unit 207.

In the second embodiment, portions corresponding to the respective portions shown in the first embodiment have the same reference symbols as in FIGS. 1 to 6, and their descriptions are omitted.

The processing unit 207 included in a substrate processing apparatus 201 according to the second embodiment is different from the processing unit 7 included in the substrate processing apparatus 1 according to the first embodiment in that the processing unit 207 comprises a second silylation agent supplying unit (silylation agent supplying unit) 202 in place of the first silylation agent supplying unit 15.

The second silylation agent supplying unit 202 includes the first two-fluid nozzle 203 for discharging liquid drops of the liquid silylation agent to the upper surface of the substrate W held by the spin chuck 12. The first two-fluid nozzle 203 has a basic form as a scan nozzle which can change the supply position of the liquid silylation agent on the upper surface of the substrate W. The first two-fluid nozzle 203 is attached to a tip end portion of a fourth nozzle arm 204 generally horizontally extending above the spin chuck 12. A fourth nozzle moving unit 205 moving the first two-fluid nozzle 203 to swing the fourth nozzle arm 204 is attached to the fourth nozzle arm 204.

The second silylation agent supplying unit 202 includes a first mixing portion 206 for mixing the silylation agent and carbonated water as a solvent (dissolving the silylation agent in carbonated water), a first silylation agent piping 208 supplying to the first mixing portion 206 the silylation agent from a silylation agent supply source, a first silylation agent valve 209 interposed in the first silylation agent piping 208, a carbonated water piping 210 supplying carbonated water of a carbonated water supply source to the first mixing portion 206, a carbonated water valve 211 interposed in the carbonated water piping 210, a first mixed liquid piping 212 connected between the first mixing portion 206 and the first two-fluid nozzle 203, a gas piping 213 supplying nitrogen gas as an example of gas from a gas supply source, and a first gas valve 214 switching supply and supply stop of gas from the gas piping 213 to the first two-fluid nozzle 203. The silylation agent is an organosilicon compound whose molecule has at one end an ethoxy (or methoxy) group providing a silanol group (Si—OH) by hydrolysis and has at the other end an organic functional group such as an amino group and a glycidyl group. HMDS and TMS can be mentioned to as examples of the silylation agent. As gas supplied to the first two-fluid nozzle 203, inert gas, dry air and clean air can also be used other than nitrogen gas.

As shown in FIG. 10, the first two-fluid nozzle 203 has a generally columnar outer shape. The first two-fluid nozzle 203 includes an outer cylinder 226 configuring a casing, and an inner cylinder 227 fitted in an inside of the outer cylinder 226.

The outer cylinder 226 and the inner cylinder 227 are coaxially disposed on a common center axis L respectively and are connected to each other. An inner space of the inner cylinder 227 serves as a linear silylation agent flow path 228 where the liquid silylation agent from the first mixed liquid piping 212 flows through. Further, a cylindrical air flow path 229 where air supplied from the gas piping 213 flows through is formed between the outer cylinder 226 and the inner cylinder 227.

The silylation agent flow path 228 opens as a silylation agent introducing port 230 at a tip end of the inner cylinder 227. The liquid silylation agent from the first mixed liquid piping 212 is introduced into the silylation agent flow path 228 via this silylation agent introducing port 230. Further, the silylation agent flow path 228 opens at a lower end of the inner cylinder 227 as a circle-shaped liquid discharging port 231 having a center on the center axis L. The silylation agent introduced into the silylation agent flow path 228 is discharged from this liquid discharging port 231.

On the other hand, the air flow path 229 is a cylindrical clearance having a center axis common to the center axis L and opens as an annular air discharging port 232 which is blocked at tip end portions of the outer cylinder 226 and the inner cylinder 227, has a center on the center axis L at lower ends of the outer cylinder 226 and the inner cylinder 227 and surrounds the liquid discharging port 231. A lower end portion of the air flow path 229 has a flow path area smaller than an intermediate portion of the air flow path 229 in a longitudinal direction and has a diameter tapered downwardly. Further, a gas introducing port 233 communicating with the air flow path 229 is formed on an intermediate portion of the outer cylinder 226.

The gas piping 213 is connected to the gas introducing port 233 with the outer cylinder 226 penetrated, and an inner space of the gas piping 213 and the air flow path 229 are communicated. Gas from the gas piping 213 is introduced into the air flow path 229 via this gas introducing port 233 and is discharged from the air discharging port 232.

While the first gas valve 214 is opened to discharge gas from the air discharging port 232, the first silylation agent valve 209 and the carbonated water valve 211 are opened to discharge the liquid silylation agent from the liquid discharging port 231, whereby a jet flow of minute liquid drops of the silylation agent can be formed by colliding (mixing) gas to the liquid silylation agent in a vicinity of an external discharging port (the liquid discharging port 231) of the first two-fluid nozzle 203. Thus, the jet flow of the minute liquid drops of the silylation agent is discharged from the first two-fluid nozzle 203 (the liquid silylation agent is discharged in a form of spray).

The spin motor 20, the first nozzle moving unit 28, the second nozzle moving unit 33, the fourth nozzle moving unit 205, the first SC1 valve 26, the rinsing liquid valve 31, the first silylation agent valve 209, the carbonated water valve 211, the first gas valve 214 and the like are connected to the controller 4 as objects to be controlled. The controller 4 controls motion of the spin motor 20, the first nozzle moving unit 28, the second nozzle moving unit 33, the fourth nozzle moving unit 205 and the like according to a predetermined program. Further, the controller 4 controls opening and closing motion and the like of the first SC1 valve 26, the rinsing liquid valve 31, the first silylation agent valve 209, the carbonated water valve 211, the first gas valve 214 and the like.

Figure 11:
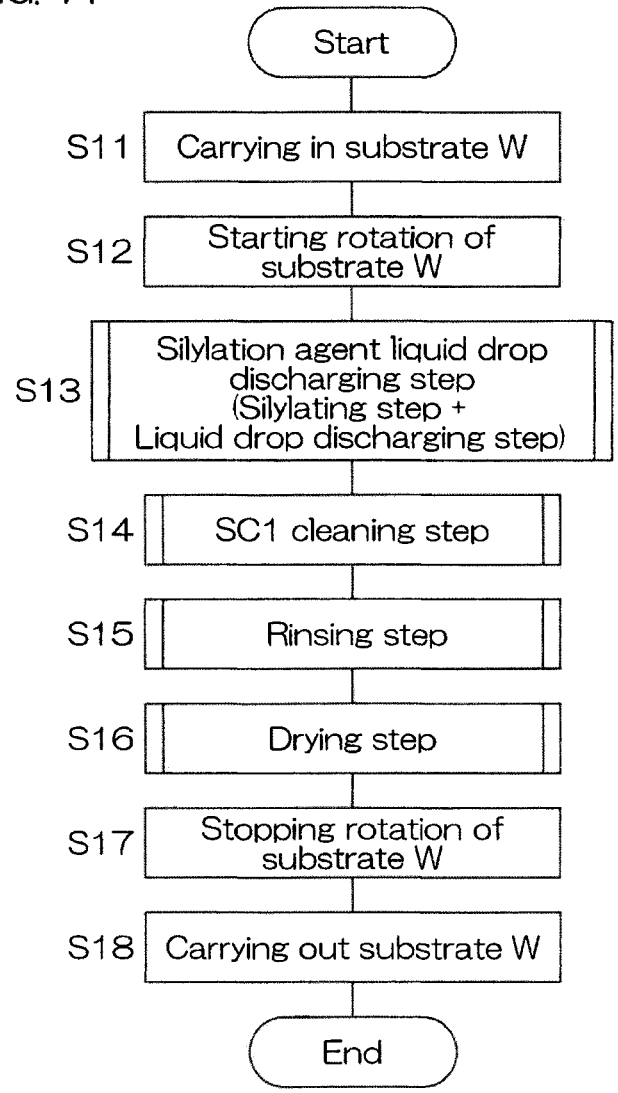
FIG. 11 is a flowchart for describing a second cleaning treatment example performed by the processing unit.
Figure 12:
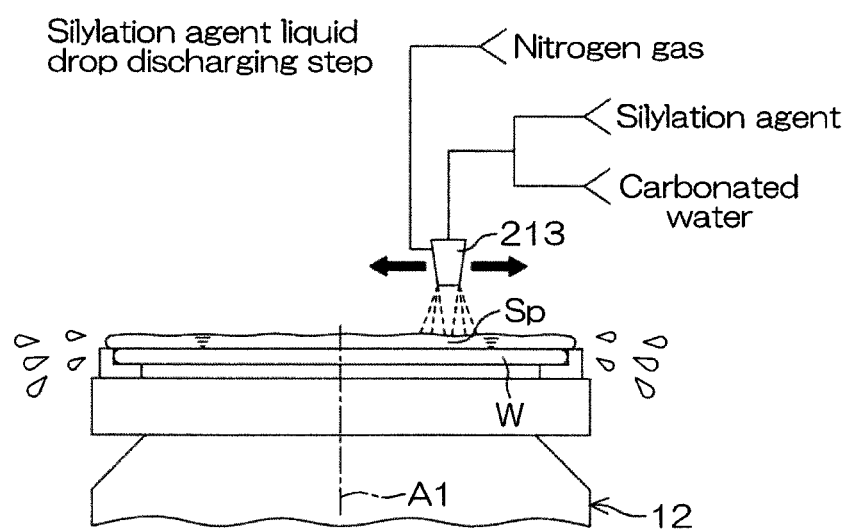
FIG. 12 is an illustrative view for describing a silylation agent liquid drop discharging step included in the second cleaning treatment example.

FIG. 11 is a flowchart for describing a second cleaning treatment example performed by the processing unit 207. FIG. 12 is an illustrative view for describing a silylation agent liquid drop discharging step (S13) included in the second cleaning treatment example.

The second cleaning treatment example is different from the first cleaning treatment example shown in FIG. 4 in that it performs the silylation agent liquid drop discharging step (step S13) in place of the silylating step (S3; see FIG. 4). The second cleaning treatment example is described referring to FIGS. 9, 11 and 12.

Steps S11, S12 shown in FIG. 11 are respectively the same as steps S1, S2 shown in FIG. 4, and steps S14 to S18 shown in FIG. 11 are respectively the same as steps S4 to S8 shown in FIG. 4. Therefore, descriptions of these steps are omitted.

A rotation speed of the substrate W reaches a predetermined liquid treatment speed after start of rotation of the substrate W (step S12), the silylation agent liquid drop discharging step (S13) is started to be performed. In the silylation agent liquid drop discharging step (S13), the controller 4 opens the first gas valve 214 and the first silylation agent valve 209 at the same time. Thus, a jet flow of minute liquid drops of the liquid silylation agent is formed in the vicinity of the external discharging port of the first two-fluid nozzle 203. That is, the jet flow of the minute liquid drops of the liquid silylation agent is discharged from the first two-fluid nozzle 203.

Since a number of liquid drops of the silylation agent are blown from the first two-fluid nozzle 203 to a supply position (hereinafter referred to simply as "the supply position") $S_P$ of the liquid silylation agent on the upper surface of the substrate W, a particle and the like adhered to the upper surface of the substrate W can be physically removed by collision of the liquid drops of the silylation agent (physical cleaning). In other words, the silylation agent liquid drop discharging step (S13) includes the silylating step of supplying the liquid silylation agent to the upper surface (surface) of the substrate W and a physical cleaning step of physically cleaning the upper surface (surface) of the substrate W concurrently to the silylating step.

Further, concurrently to the discharge of the jet flow of the liquid drops of the silylation agent from the first two-fluid nozzle 203, the controller 4 controls the fourth nozzle moving unit 205 to make the supply position $S_P$ reciprocate or move in one direction between the upper surface center portion of the substrate W and an upper surface peripheral portion of the substrate W. Since the supply position $S_P$ is moved between the upper surface center portion of the substrate W and the upper surface peripheral portion of the substrate W while the substrate W is being rotated, the supply position S$_P$ passes the entire area of the upper surface of the substrate W. Thus, the silylation agent can be supplied to the entire area of the upper surface of the substrate W, and the entire area of the upper surface of the substrate W can be evenly treated.

After a predetermined period has passed from start of the discharge of the silylation agent, the first silylation agent valve 209 and the carbonated water valve 211 are closed to stop the discharge of the liquid silylation agent from the first two-fluid nozzle 203. Further, the controller 4 retreats the first two-fluid nozzle 203 from above the spin chuck 12 by controlling the fourth nozzle moving unit 205. Thus, the silylation agent liquid drop discharging step (S13) is finished. After the silylation agent liquid drop discharging step (S13) is finished, the SC1 cleaning step (S14; chemical liquid cleaning step; latter supplying step) is started.

According to the second embodiment, the same operational effect described in the first embodiment is obtained, and an operational effect described below is obtained additionally. That is, since the upper surface (surface) of the substrate W is cleaned not only by the supply of SC1 but also by the physical cleaning using the first two-fluid nozzle 203, the upper surface (surface) of the substrate W can be cleaned even more favorably as a result.

Figure 13:
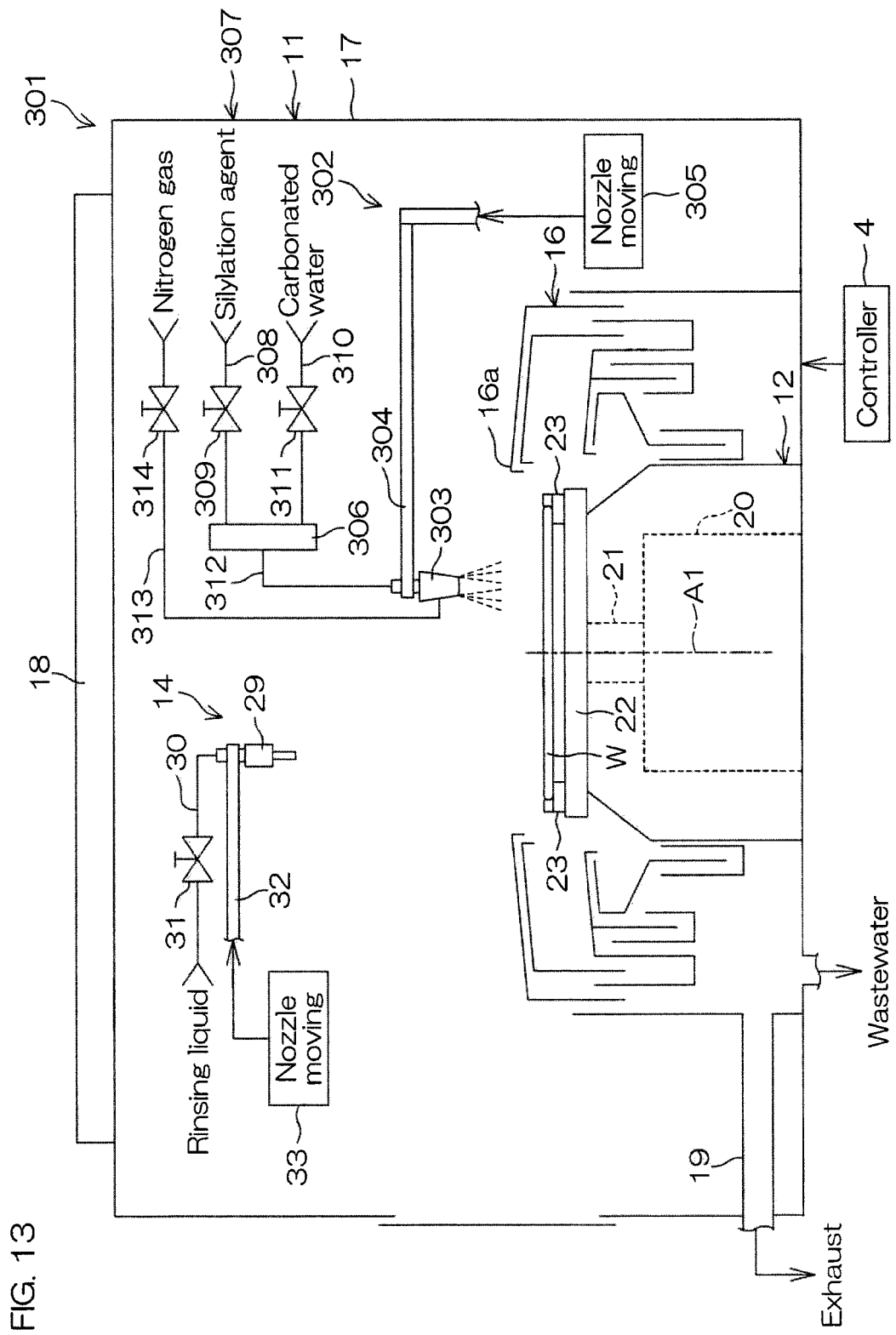
FIG. 13 is a view of a processing unit according to a third embodiment of the present invention in the horizontal direction.

FIG. 13 is a view of a processing unit 307 according to a third embodiment of the present invention in the horizontal direction.

In the third embodiment, portions corresponding to the respective portions shown in the first embodiment have the same reference symbols as in FIGS. 1 to 6, and their descriptions are omitted.

The processing unit 307 included in a substrate processing apparatus 301 according to the third embodiment is different from the processing unit 7 included in the substrate processing apparatus 1 according to the first embodiment in that the processing unit 307 comprises a silylation agent & SC1 supplying unit (silylation agent supplying unit, cleaning chemical liquid supplying unit) 302 in place of the SC1 supplying unit 13 and the first silylation agent supplying unit 15.

The silylation agent & SC1 supplying unit 302 includes a second two-fluid nozzle 303 for discharging liquid drops of SC1 containing the silylation agent (hereinafter referred to as "the silylation-agent-containing SC1") to the upper surface of the substrate W held by the spin chuck 12. The second two-fluid nozzle 303 has a basic form as a scan nozzle which can change the supply position of the silylation-agent-containing SC1 on the upper surface of the substrate W. The second two-fluid nozzle 303 is attached to a tip end portion of a fifth nozzle arm 304 generally horizontally extending above the spin chuck 12. A fifth nozzle moving unit 305 moving the second two-fluid nozzle 303 to swing the fifth nozzle arm 304 is connected to the fifth nozzle arm 304.

The silylation agent & SC1 supplying unit 302 includes a second mixing portion 306 for mixing, for example, a solid-type silylation agent and SC1 as a cleaning chemical liquid (dissolving the silylation agent in the cleaning chemical liquid), a second silylation agent piping 308 supplying to the second mixing portion 306 the silylation agent from the silylation agent supply source, a second silylation agent valve 309 interposed in the second silylation agent piping 308, a second SC1 piping 310 supplying SC1 of a SC1 supply source to the second mixing portion 306, a second SC1 valve 311 interposed in the second SC1 piping 310, a second mixed liquid piping 312 connected between the second mixing portion 306 and the second two-fluid nozzle 303, a second gas piping 313 supplying nitrogen gas as an example of gas from the gas supply source, and a second gas valve 314 switching supply and supply stop of gas from the second gas piping 313 to the second two-fluid nozzle 303. The silylation agent is an organosilicon compound whose molecule has at one end an ethoxy (or methoxy) group providing a silanol group (Si—OH) by hydrolysis and has at the other end an organic functional group such as an amino group and a glycidyl group. HMDS and TMS can be mentioned to as examples of the silylation agent. As gas supplied to the second two-fluid nozzle 303, inert gas, dry air and clean air can also be used other than nitrogen gas. The second two-fluid nozzle 303 has generally the same form as the first two-fluid nozzle 203 according to the second embodiment. A detailed description with respect to the second two-fluid nozzle 303 is omitted.

By opening both of the second silylation agent valve 309 and the second SC1 valve 311, the silylation agent and SC1 are supplied to the second mixing portion 306 to be sufficiently mixed in the second mixing portion 306, whereby the silylation-agent-containing SC1 is produced. Further, even when the silylation agent (HMDS or TMS) contaminates SC1, a severe reaction does not occur. Therefore, a severe reaction does not occur through that the silylation agent and SC1 are mixed in the second mixing portion 306.

While the second gas valve 314 is opened to discharge gas from the air discharging port 232 (see FIG. 10), the second silylation agent valve 309 and the second SC1 valve 311 are opened to discharge the silylation-agent-containing SC1 from a liquid discharging port (corresponding to the liquid discharging port 231 in FIG. 10), whereby a jet flow of minute liquid drops of the silylation-agent-containing SC1 can be formed by colliding (mixing) gas to the silylation-agent-containing SC1 in a vicinity of an external discharging port (corresponding to the liquid discharging port 231 in FIG. 10) of the second two-fluid nozzle 303. Thus, the jet flow of the liquid drops of the silylation-agent-containing SC1 is discharged from the second two-fluid nozzle 303 (the silylation-agent-containing SC1 is discharged in a form of spray).

The spin motor 20, the second nozzle moving unit 33, the fifth nozzle moving unit 305, the rinsing liquid valve 31, the second silylation agent valve 309, the second SC1 valve 311, the second gas valve 314 and the like are connected to the controller 4 as objects to be controlled. The controller 4 controls motion of the spin motor 20, the second nozzle moving unit 33, the fifth nozzle moving unit 305 and the like according to a predetermined program. Further, the controller 4 controls opening and closing motion and the like of the rinsing liquid valve 31, the second silylation agent valve 309, the second SC1 valve 311, the second gas valve 314 and the like.

Figure 14:
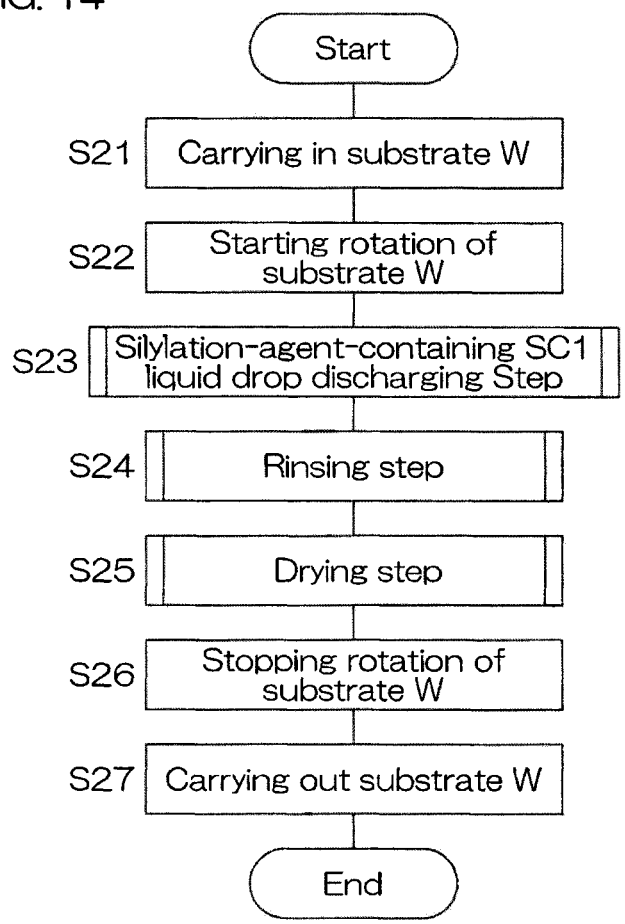
FIG. 14 is a flowchart for describing a third cleaning treatment example performed by the processing unit.

FIG. 14 is a flowchart for describing a third cleaning treatment example performed by the processing unit 307.

The third cleaning treatment example is different from the first cleaning treatment example shown in FIG. 4 in that it performs the silylation-agent-containing SC1 liquid drop discharging step (step S23; parallel supplying step) in place of the silylating step (S3; see FIG. 4). The third cleaning treatment example is described referring to FIGS. 13 and 14.

Steps S11, S12 shown in FIG. 14 are respectively the same as steps S1, S2 shown in FIG. 4, and steps S24 to S27 shown in FIG. 14 are respectively the same as steps S5 to S8 shown in FIG. 4. Therefore, descriptions of these steps are omitted.

When a rotation speed of the substrate W reaches a predetermined liquid treatment speed after start of rotation of the substrate W (step S22), the silylation-agent-containing SC1 liquid drop discharging step (S23) is started to be performed. In the silylation-agent-containing SC1 liquid drop discharging step (S23), the controller 4 opens the second gas valve 314 and the second silylation agent valve 309 at the same time. Thus, a jet flow of minute liquid drops of the silylation-agent-containing SC1 is formed in the vicinity of the external discharging port of the second two-fluid nozzle 303. That is, the jet flow of the liquid drops of the silylation-agent-containing SC1 is discharged from the second two-fluid nozzle 303.

Since a number of liquid drops of the silylation-agent-containing SC1 are blown from the second two-fluid nozzle 303 to a supply position of the silylation-agent-containing SC1 on the upper surface of the substrate W. Therefore, a particle and the like adhered to the upper surface of the substrate W can be physically removed by collision of the liquid drops of the silylation-agent-containing SC1 (physical cleaning). Further, the upper surface of the substrate W is cleaned through that SC1 in the silylation-agent-containing SC1 is supplied to the upper surface of the substrate W. In other words, the silylation-agent-containing SC1 liquid drop discharging step (S23) includes a silylating step of supplying the liquid silylation agent to the upper surface (surface) of the substrate W, a physical cleaning step of physically cleaning the upper surface (surface) of the substrate W concurrent to the silylating step, and a cleaning chemical liquid supplying step of supplying SC1 (cleaning chemical liquid) to the upper surface (surface) of the substrate W.

Further, concurrently to the discharge of the jet flow of the liquid drops of the silylation agent from the second two-fluid nozzle 303, the controller 4 controls the fifth nozzle moving unit 305 to make the supply position of the silylation-agent-containing SC1 on the upper surface of the substrate W reciprocate or move in one direction between the upper surface center portion of the substrate W and the upper surface peripheral portion of the substrate W. Since the supply position of the silylation-agent-containing SC1 on the upper surface of the substrate W is moved between the upper surface center portion of the substrate W and the upper surface peripheral portion of the substrate W while the substrate W is being rotated, this supply position passes the entire area of the upper surface of the substrate W. Thus, the silylation-agent-containing SC1 can be supplied to the entire area of the upper surface of the substrate W, and the entire area of the upper surface of the substrate W can be evenly treated. Since the silylation agent is contained in the silylation-agent-containing SC1 supplied to the upper surface of the substrate W, the entire area of the upper surface (surface) of the substrate W is silylated. As shown in FIGS. 6A, 6B, due to silylation of the surface of the substrate W, silanol groups (Si—OH) present on the surface 41a of the silicon substrate 41 and the surface layers of the films 43, 47, 48, 49, 50 are displaced by trimethylsilyl groups (Si—(CH$_3$)$_3$). Therefore, after the silylation of the surface of the substrate W, the surface 41a of the silicon substrate 41 and the surface layers of the films 43, 47, 48, 49, 50 are covered by an umbrella of methyl groups, whereby a protective layer having a chemical resistance to SC1 is formed on the surface layers of the films 43, 47, 48, 49, 50.

Further, a particle and the like can be favorably removed from the upper surface of the substrate W by SC1 contained in the silylation-agent-containing SC1. Similar to the SC1 cleaning step (S4) according to the first embodiment, the silylation-agent-containing SC1 liquid drop discharging step (S23) according to the third embodiment is a treatment where the impurities 51 (particles, minute impurities and the like) adhered to the surface of the substrate W (the surface of the silicon substrate 41 itself and the surface of the fine pattern 40) are removed from the surface of the substrate W by supplying the silylation-agent-containing SC1 to the surface of the substrate W, as shown in FIG. 7, and is different from the above-described etching treatment (wet etching).

After a predetermined period has passed from start of the discharge of the silylation-agent-containing SC1, the first silylation agent valve 209 and the carbonated water valve 211 are closed to stop the discharge of the liquid silylation agent from the second two-fluid nozzle 303. Further, the controller 4 retreats the second two-fluid nozzle 303 from above the spin chuck 12 by controlling the fifth nozzle moving unit 305. Thus, the silylation-agent-containing SC1 liquid drop discharging step (S23) is finished. After the silylation-agent-containing SC1 liquid drop discharging step (S23) is finished, a rinsing step (S24) is started.

According to the third embodiment, the same operational effect described in the first embodiment is obtained, and an operational effect described below is additionally obtained. That is, the silylating step and the chemical liquid cleaning step are performed concurrently to each other. In other words, concurrently to the supply of SC1 to the upper surface of the substrate W, the surface 41a of the silicon substrate 41 and the films 43, 47, 48, 49, 50 are covered by the protective layer. While the surface 41a of the silicon substrate 41 and the films 43, 47, 48, 49, 50 are covered by the protective layer (that is, the SiGe film 50 is covered by the protective layer), the cleaning treatment using SC1 can be performed. Therefore, loss of a film (in particular, loss of the SiGe film 50) is difficult to occur in the silylation-agent-containing SC1 liquid drop discharging step (S23). Thus, the surface of this substrate W can be cleaned using SC1 while trying to reduce or prevent the loss of the SiGe film 50.

Further, even when the silylation agent (HMDS or TMS) contaminates SC1, a severe reaction does not occur. Therefore, even when the silylation agent and SC1 contaminate in the second mixing portion 306 in the silylation-agent-containing SC1 liquid drop discharging step (S23), there is not any concern that a severe reaction occurs in the second mixing portion 306. Thus, an entire treatment time can be shortened without causing a severe reaction between the silylation agent and the cleaning chemical liquid.

Figure 15:
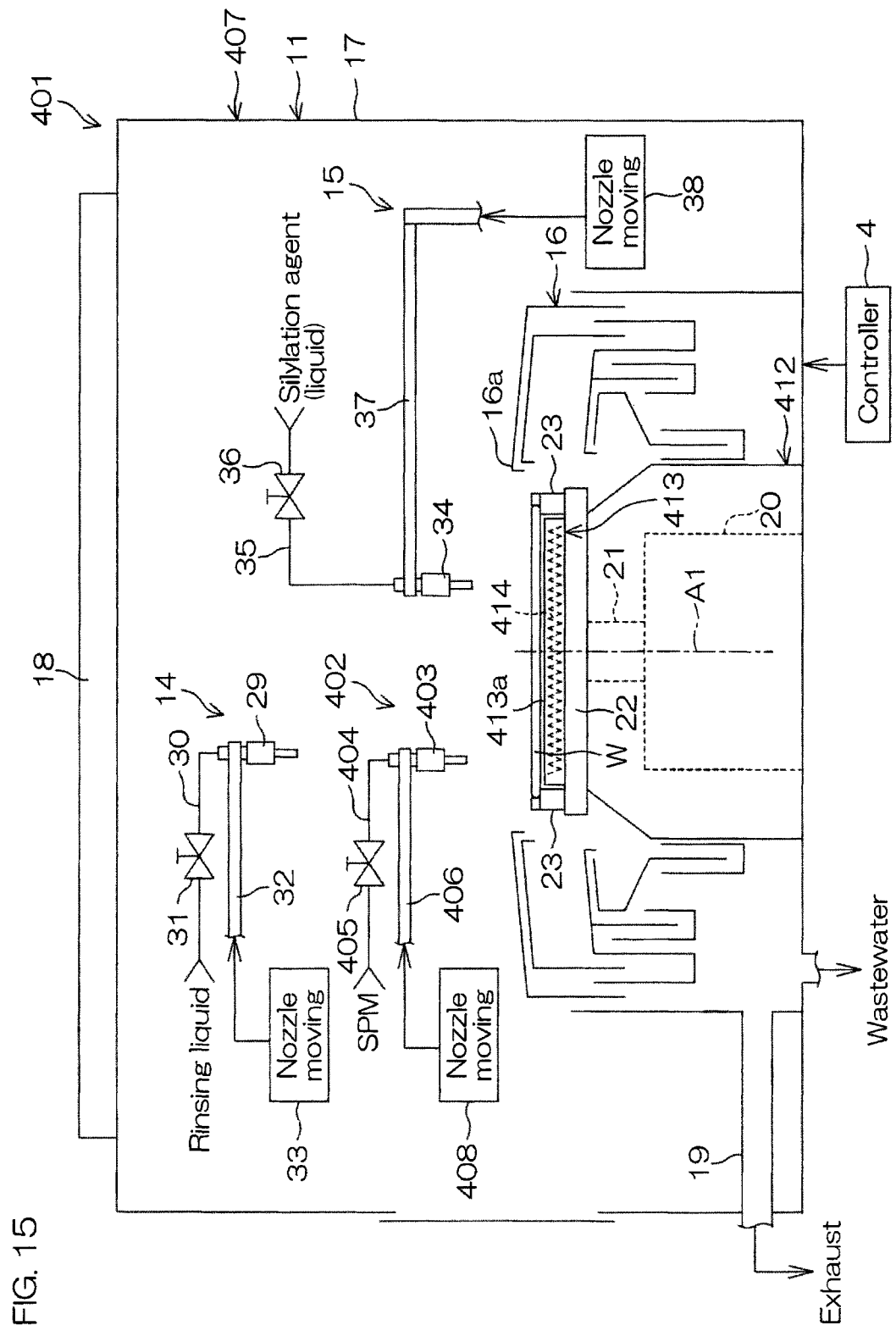
FIG. 15 is a view of a processing unit according to a fourth embodiment of the present invention in the horizontal direction.

FIG. 15 is a view of a processing unit 407 according to a fourth embodiment of the present invention in the horizontal direction.

In the fourth embodiment, portions corresponding to the respective portions shown in the first embodiment have the same reference symbols as in FIGS. 1 to 6, and their descriptions are omitted.

The processing unit 407 included in a substrate processing apparatus 401 according to the fourth embodiment is different from the processing unit 7 included in the substrate processing apparatus 1 according to the first embodiment in that in place of the SC1 supplying unit 13, the processing unit 407 comprises an SPM supplying unit (cleaning chemical liquid supplying unit) 402 for supplying SPM (sulfuric acid/hydrogen peroxide mixture) as an example of an acid cleaning chemical liquid (cleaning chemical liquid). That is, the processing unit 407 performs a resist removing treatment of removing a resist which is formed on the surface of the substrate W (the pattern forming surface where a pattern is formed) and becomes unnecessary after ion implantation using, for example, SPM as a cleaning chemical liquid. Further, it is different in that a spin chuck 412 with a hot plate 413 is used in place of the spin chuck 12.

The SPM supplying unit 402 includes an SMP nozzle 403 discharging SMP, SMP piping 404 connected to the SMP nozzle 403, an SMP valve 405 interposed in the SMP piping 404, a sixth nozzle arm 406 to whose tip end portion the SMP nozzle 403 is attached, and a sixth nozzle moving unit 408 moving the SMP nozzle 403 by swinging the sixth nozzle arm 406.

When the SMP valve 405 is opened, SMP supplied from the SMP piping 404 to the SMP nozzle 403 is discharged downward from the SMP nozzle 403. When the SMP valve 405 is closed, discharge of SMP from the SMP nozzle 403 is stopped. The sixth nozzle moving unit 408 moves the SMP nozzle 403 between a treatment position where SMP discharged from the SMP nozzle 403 is supplied to the upper surface of the substrate W and a retreat position where the SMP nozzle 403 has retreated to the lateral side of the spin chuck 412 in a plan view. Further, the sixth nozzle moving unit 408 moves a supply position of SMP within the upper surface of the substrate W by moving the SMP nozzle 403 along the upper surface of the substrate W.

The spin chuck 412 according to the fourth embodiment has configurations common to the spin chuck 12 according to the first embodiment except for having the hot plate 413. Portions of the spin chuck 412 corresponding to the respective portions of the spin chuck 12 have the same reference symbols as in FIGS. 1 to 6, and their descriptions are omitted.

The hot plate 413 as a heat generating member heats a substrate W held by the clamping members 23. The hot plate 413 is a resistance-type heater and is accommodated in a space between the spin base 22 and the substrate W held by the clamping members 23. The hot plate 413 is formed using ceramic or silicon carbide (SiC), for example, and has a disk shape. An upper surface of the hot plate 413 has a planar substrate opposing surface 413a having a circular shape slightly smaller in diameter than the substrate W. For example, a resistance-type heater 414 is embedded in an inside of the hot plate 413. The heater 414 generates heat through energization to the resistance-type heater 414, whereby the entire hot plate 413 including the substrate opposing surface 413a generates heat. The hot plate 413 is provided in such a manner that the substrate opposing surface 413a is in proximity of a lower surface of the substrate W, whereby in a state where the hot plate 413 is heated, heat from the substrate opposing surface 413a is fed to the substrate W by heat radiation, and thus the substrate W is warmed.

The spin motor 20, the second nozzle moving unit 33, the third nozzle moving unit 38, the sixth nozzle moving unit 408, the rinsing liquid valve 31, the silylation agent valve 36, the SMP valve 405 and the like are connected to the controller 4 as objects to be controlled. The controller 4 controls motion of the spin motor 20, the second nozzle moving unit 33, the third nozzle moving unit 38, he sixth nozzle moving unit 408 and the like according to a predetermined program. Further, the controller 4 controls opening and closing motion and the like of the rinsing liquid valve 31, the silylation agent valve 36, the SMP valve 405 and the like.

Figure 16:
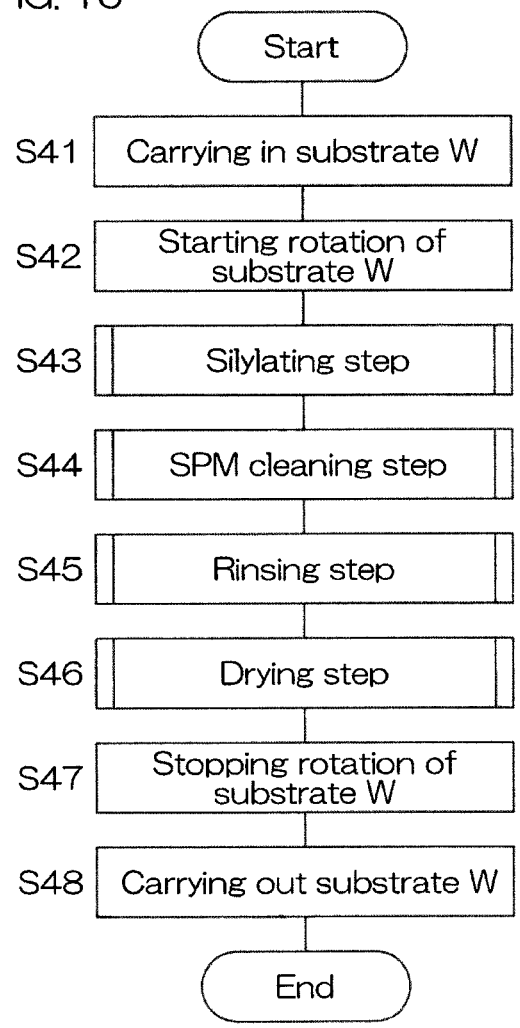
FIG. 16 is a flowchart for describing a fourth cleaning treatment example performed by the processing unit.

FIG. 16 is a flowchart for describing a fourth cleaning treatment example performed by the processing unit 407.

The fourth cleaning treatment example is different from the first cleaning treatment example shown in FIG. 4 in that it performs an SPM cleaning step (step S44; chemical liquid cleaning step; latter supplying step) in place of the SC1 cleaning step (S4; see FIG. 4). The fourth cleaning treatment example is a treatment example of the resist removing treatment performed by the processing unit 7. The fourth cleaning treatment example is described referring to FIGS. 15 and 16.

When the substrate W is treated by the substrate processing apparatus 401, the substrate W is brought into the chamber 11 (step S41). The substrate W brought into the chamber 11 is a substrate after an ion implantation treatment at a high dose, for example. The substrate W is placed on the spin chuck 412 with the surface (forming surface of a resist pattern) thereof facing upward. Thereafter, rotation of the substrate W is started (step S42). Then a silylating step (step S43) is started to be performed. Steps S41 to S43 shown in FIG. 16 are respectively the same as steps S1 to S3 shown in FIG. 4. The upper surface of the substrate W is silylated by the silylating step (S43), and as shown in FIG. 6B, after the silylation of the upper surface of the substrate W, the surface 41a of the silicon substrate 41 and the surface layers of the films 43, 47, 48, 49, 50 are covered by an umbrella of methyl groups, whereby a protective layer having a chemical resistance to SPM is formed on the surface layers of the films 43, 47, 48, 49, 50.

After the silylating step (S43) is finished, the SPM cleaning step (S44) of supplying SPM to the substrate W is performed. Specifically, the controller 4 controls the sixth nozzle moving unit 408 to move the SMP nozzle 403 from the retreat position to the treatment position. Thereafter, the controller 4 opens the SMP valve 405 to discharge SPM from the SMP nozzle 403 toward the upper surface of the substrate W being rotated. Further, while the substrate W is rotated, the controller 4 moves a supply position of SPM to the upper surface of the substrate W between the upper surface center portion and the upper surface outer peripheral portion. Thus, the supply position of SPM passes the entire area of the upper surface of the substrate W, and the entire area of the upper surface of the substrate W is scanned. Therefore, SPM discharged from the SMP nozzle 403 is directly supplied to the entire area of the upper surface of the substrate W to treat the entire area of the upper surface of the substrate W evenly. Thus, resists are favorably removed from the upper surface of the substrate W.

After a predetermined period has passed from start of the supply of SPM to the substrate W, the controller 4 closes the SMP valve 405 to stop the discharge of SPM from the SMP nozzle 403. Further, the controller 4 retreats the SMP nozzle 403 from above the spin chuck 412 by controlling the sixth nozzle moving unit 408.

$SiO_2$ and SiN fabricated by the plasma CVD method can be easily removed by reacting with SPM. Therefore, in the SPM cleaning step (S44) of supplying SPM to the upper surface of the substrate W, a loss may be caused in the first $SiO_2$ film 43, the third $SiO_2$ film 48 and/or the SiN film 49. Accordingly, the upper surface of the substrate W needs to be protected.

The fine pattern 40 is formed on the surface of the substrate W. Along with miniaturization and three-dimensionalization of such a pattern, an allowable range of film loss is narrowed. That is, even in the resist removing treatment by SPM where film loss has conventionally not been a problem, a possibility that film loss may influence a transistor characteristic of a semiconductor becomes obvious. In such a SPM cleaning step (S44; this is also true to a SPM cleaning step (S55) later described), it is required to try to reduce or prevent loss of the films 43, 48, 49 along with the SPM cleaning.

However, since the SPM cleaning step (S44) is performed in a state where the surface 41a of the silicon substrate 41 and the films 43, 47, 48, 49, 50 are covered by the protective layer (that is, the surface layers of the films 43, 48, 49 are covered by the protective layer), loss of a film (in particular, loss of the films 43, 48, 49) is difficult to occur in the SPM cleaning step (S44).

Further, along with the supply of SPM to the upper surface of the substrate W, trimethylsilyl groups (Si—(CH$_3$)$_3$) present on the surface 41a of the silicon substrate 41 and the surface layers of the films 43, 47, 48, 49, 50 are displaced by silanol groups (Si—OH). Thus, the protective layer formed on the surface 41a of the silicon substrate 41 and the surface layers of the films 43, 47, 48, 49, 50 is washed away by SPM which is a cleaning chemical liquid.

Next, a rinsing step (step S45) of supplying a rinsing liquid to the upper surface of the substrate W is performed. After the rinsing step (step S45) is finished, a drying step (step S46) is performed. After the drying step (S46) is finished, the controller 4 stops the rotation of the substrate W (step S47) and makes the treated substrate W brought out from the chamber 11 (step S48). Steps S45 to S48 shown in FIG. 16 are the same as the steps S5 to S8 shown in FIG. 4 respectively.

Figure 17:
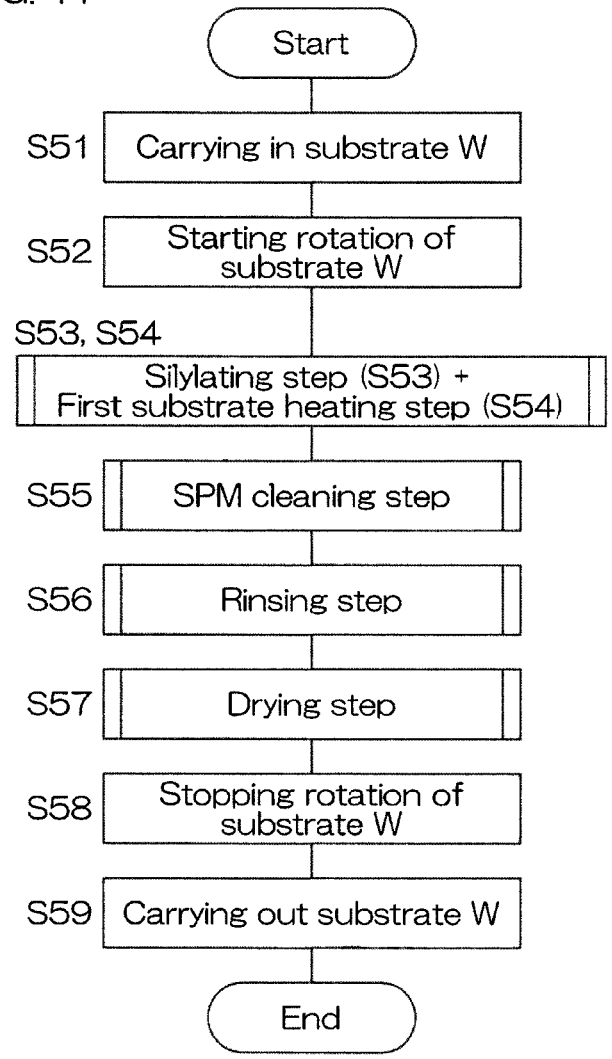
FIG. 17 is a flowchart for describing a fifth cleaning treatment example performed by the processing unit.
Figure 18:
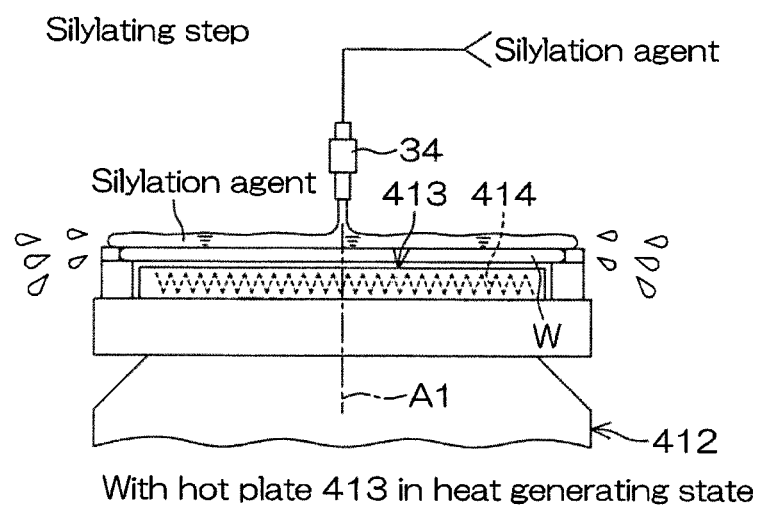
FIG. 18 is an illustrative view for describing a silylating step included in the fifth cleaning treatment example.

FIG. 17 is a flowchart for describing a fifth cleaning treatment example performed by the processing unit 407. FIG. 18 is an illustrative view for describing a silylating step (S53) included in the fifth cleaning treatment example.

The fifth cleaning treatment example according to the fourth embodiment is different from the fourth cleaning treatment example shown in FIG. 16 in that it performs a substrate heating step (step S54) in parallel with the silylating step (S53). The fifth cleaning treatment example is described referring to FIGS. 15 and 17.

Steps S51, S52 shown in FIG. 17 are respectively the same as steps S41, S42 shown in FIG. 16. Further, steps S55 to S59 shown in FIG. 16 are respectively the same as steps S44 to S48 shown in FIG. 4. Therefore, descriptions of these steps are omitted.

A rotation speed of the substrate W reaches a predetermined liquid treatment speed after start of rotation of the substrate W (step S52), the silylating step (S53) is started to be performed.

Specifically, the controller 4 moves the silylation agent nozzle 34 from the retreat position to the treatment position by controlling the third nozzle moving unit 38. When the silylation agent nozzle 34 is disposed above the upper surface center portion of the substrate W, the controller 4 opens the silylation agent valve 36 to discharge the liquid silylation agent from the silylation agent nozzle 34 toward the upper surface center portion of the substrate W being rotated, as shown in FIG. 18. The silylation agent supplied to the upper surface center portion of the substrate W receives a centrifugal force due to the rotation of the substrate W and moves toward the upper surface outer peripheral portion of the substrate W. Thus, the silylation agent reaches the entire area of the upper surface of the substrate W. Thus, the upper surface (surface) of the substrate W is silylated, and a protective layer is formed on the surface layers of the films 43, 47, 48, 49, 50.

As shown in FIG. 18, the controller 4 (see FIG. 1) controls the hot plate 413 to a heated state in parallel with the silylating step (S53). Specifically, prior to start of the discharge of the liquid silylation agent from the silylation agent nozzle 34, the controller 4 controls the resistance-type heater 414 on to control the hotplate 413 to the heated state. By heating of the substrate W by the hot plate 413, the substrate W is caused to become a high temperature of a predetermined first high temperature. In this embodiment, the first high temperature is a temperature enough to remove mois-ture contained in the fine pattern 40 of the upper surface of the substrate W (for example, about 100° C. or more). Then, after a time where the substrate opposing surface 413a of the hot plate 413 reaches to the first high temperature has passed from start of heat generation of the hot plate 413, the controller 4 causes the discharge of the liquid silylation agent from the silylation agent nozzle 34 to be started.

Heating of the substrate W by the hot plate 413 is continued after the start of the discharge of the silylation agent. Therefore, a reaction speed of the surface 41a of the silicon substrate 41 and the surface layers of the films 43, 47, 48, 49, 50 included in the upper surface of the substrate W with silyl groups which the silylation agent has is high.

After a predetermined period has passed from start of the supply of the liquid silylation agent to the substrate W, the controller 4 closes the silylation agent valve 36 to stop the discharge of the silylation agent from the silylation agent nozzle 34. Further, the controller 4 retreats the silylation agent nozzle 34 from above the spin chuck 412 by controlling the third nozzle moving unit 38. Further, the controller 4 controls the heater 414 off to cause the hot plate 413 to leave the heat generating state.

Next, the SPM cleaning step (step S55) of supplying SPM to the substrate W to clean the upper surface of the substrate W is performed.

Further, the hot plate 413 provided on the spin chuck 412 may be capable of ascending and descending. In this case, an ascending and descending unit (not shown) for ascending and descending the hot plate 413 may be coupled to the hot plate 413. The ascending and descending unit ascends and descends the hot plate 413 between an upper position where the substrate opposing surface 413a is in proximity of the lower surface of the substrate W and a lower position where the substrate opposing surface 413a greatly retreats to below the substrate W. The ascending and descending unit holds the hot plate 413 in a horizontal posture at each position between the upper position and the lower position.

In this case, while the fifth cleaning treatment example to the substrate W is performed, the controller 4 steadily retains the hot plate 413 in a heated state by controlling the heater 414. In a step (S51, S52 shown in FIG. 16) prior to the silylating step (S53), the hot plate 413 is disposed in the lower position. At a time of performing the drying step (S57), the controller 4 controls the ascending and descending unit to move the hotplate 413 in the heated state from the lower position toward the upper position and disposes the hot plate 413 in the upper position. Thus, the substrate W is warmed by the hot plate 413.

As described above, according to the fourth embodiment, the silylating step (S43, S55) is performed prior to the SPM cleaning step (S44, S55). In the silylating step (S43, S55), the surface 41a of the silicon substrate 41 and the surface layers of the films 43, 47, 48, 49, 50 are silylated (reformed) by the silylation agent, and the surface 41a of the silicon substrate 41 and the surface layers of the films 43, 47, 48, 49, 50 are covered by the protective layer. The SPM cleaning step (S44, S55) can be performed in the state where the surface layers of the films 43, 48, 49 are covered by the protective layer. Therefore, the loss of the films 43, 48, 49 is difficult to occur in the SPM cleaning step (S44, S55). Thus, the surface of the substrate W having the fine pattern 40 can be cleaned using SPM while trying to reduce or prevent the loss of the films 43, 48, 49 included in the fine pattern 40.

Further, according to the fifth cleaning treatment example, the reaction speed of the surface 41a of the silicon substrate 41 and the surface layers of the films 43, 47, 48, 49, 50 with silyl groups which the silylation agent has is heightened. Therefore, a robust protective film can be formed on the surface 41a of the silicon substrate 41 and the surface layers of the films 43, 47, 48, 49, 50 in the silylating step (S53). Thus, the loss of the films 43, 48, 49 in the SPM cleaning step (S55) can be even more effectively reduced.

Further, the silylating step (S43, S55) and the SPM cleaning step (S44, S55) are performed using the common processing unit 407. In this case, it is not required to transfer the substrate W in the middle of a series of treatments to the substrate W, whereby this series of treatments can be performed in a short time.

Additionally, when the fifth cleaning treatment example is performed in the fourth embodiment, it is needed to provide the spin chuck 412 with the hot plate 413 as a spin chuck. However, when the fourth cleaning treatment example is performed, any of the spin chuck 412 with the hot plate 413 and the spin chuck 12 without the hot plate 413 may be provided as a spin chuck.

Figure 19:
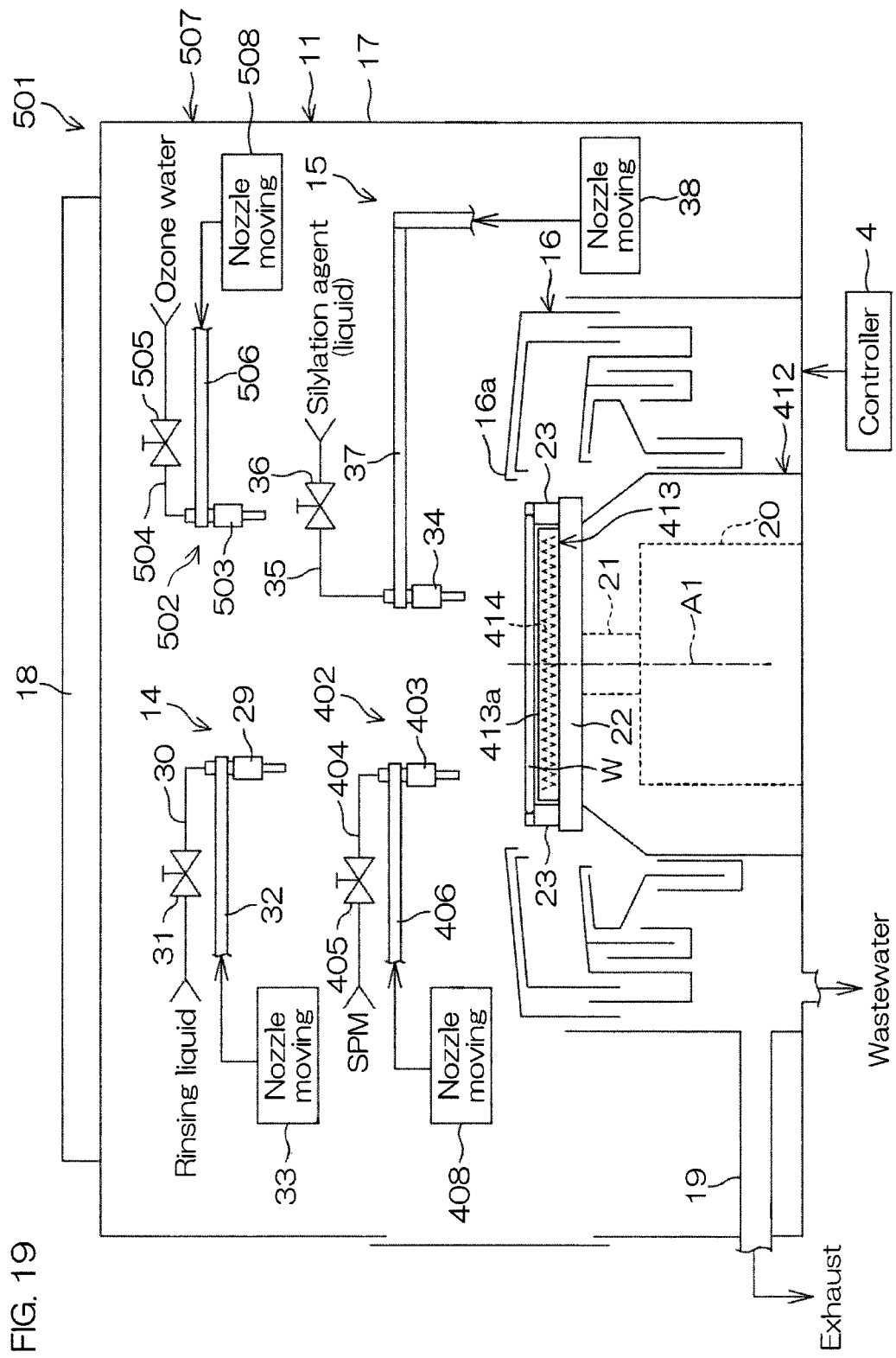
FIG. 19 is a view of a processing unit according to a fifth embodiment of the present invention in the horizontal direction.

FIG. 19 is a view of a processing unit 507 according to a fifth embodiment of the present invention in the horizontal direction.

In the fifth embodiment, portions corresponding to the respective portions shown in the fourth embodiment have the same reference symbols as in FIGS. 15 to 18, and their descriptions are omitted.

The processing unit 507 included in a substrate processing apparatus 501 according to the fifth embodiment is different from the processing unit 407 included in the substrate processing apparatus 401 according to the fourth embodiment in that the processing unit 507 comprises an ozone water supplying unit 502 for supplying ozone water (water containing O₃).

The ozone water supplying unit 502 includes an ozone water nozzle 503 discharging ozone water, ozone water piping 504 connected to the ozone water nozzle 503, an ozone water valve 505 interposed in the ozone water piping 504, a seventh nozzle arm 506 to whose tip end portion the ozone water nozzle 503 is attached, and a seventh nozzle moving unit 508 moving the ozone water nozzle 503 by swinging the seventh nozzle arm 506.

When the ozone water valve 505 is opened, ozone water supplied from the ozone water piping 504 to the ozone water nozzle 503 is discharged downward from the ozone water nozzle 503. When the ozone water valve 505 is closed, discharge of ozone water from the ozone water nozzle 503 is stopped. The seventh nozzle moving unit 508 moves the ozone water nozzle 503 between a treatment position where ozone water discharged from the ozone water nozzle 503 is supplied to the upper surface of the substrate W and a retreat position where the ozone water nozzle 503 has retreated to the lateral side of the spin chuck 412 in a plan view.

The spin motor 20, the second nozzle moving unit 33, the third nozzle moving unit 38, the sixth nozzle moving unit 408, the seventh nozzle moving unit 508, the rinsing liquid valve 31, the silylation agent valve 36, the SMP valve 405, the ozone water valve 505 and the like are connected to the controller 4 as objects to be controlled. The controller 4 controls motion and the like of the spin motor 20, the second nozzle moving unit 33, the third nozzle moving unit 38, the sixth nozzle moving unit 408, the seventh nozzle moving unit 508 and the like according to a predetermined program. Further, the controller 4 controls opening and closing motion and the like of the rinsing liquid valve 31, the silylation agent valve 36, the SMP valve 405, the ozone water valve 505 and the like.

Figure 20:
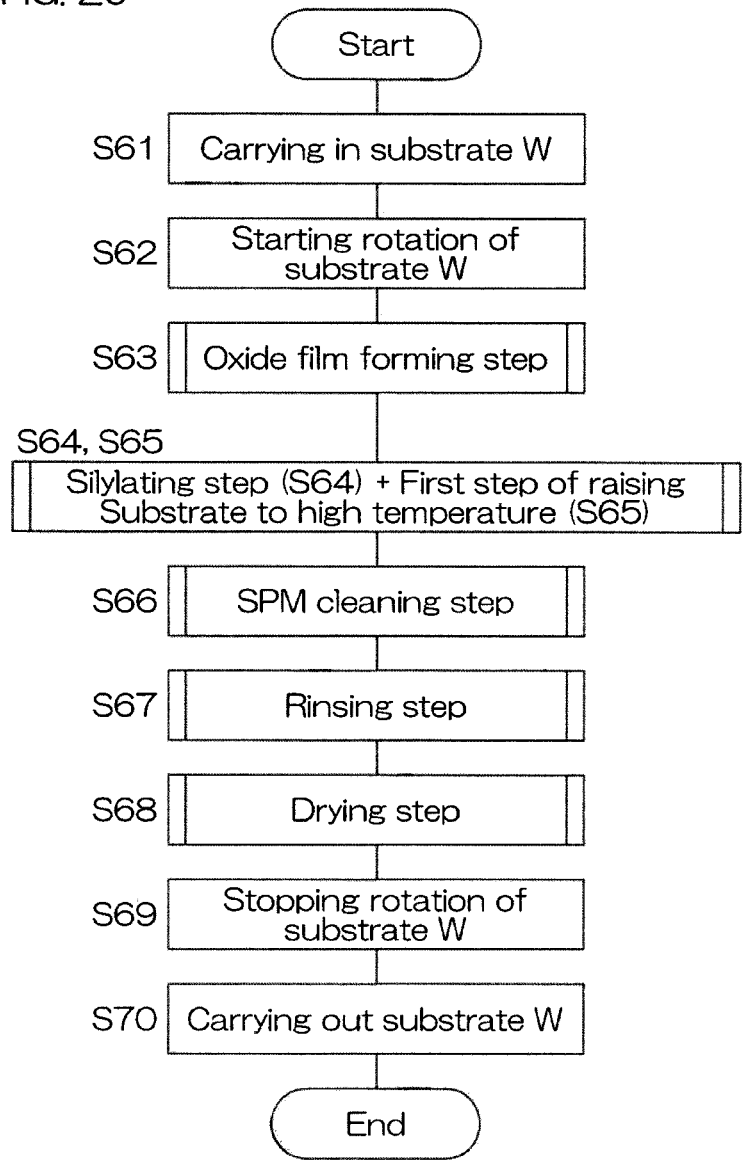
FIG. 20 is a flowchart for describing a sixth cleaning treatment example performed by the processing unit.
Figure 21:
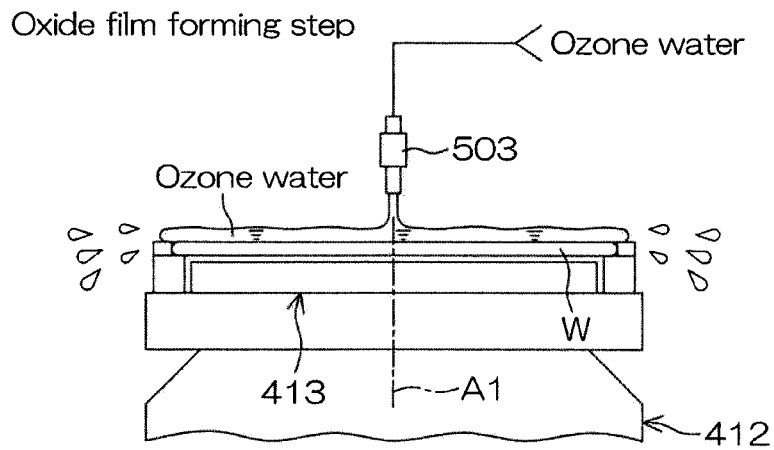
FIG. 21 is an illustrative view for describing an oxide film forming step included in the sixth cleaning treatment example.

FIG. 20 is a flowchart for describing a sixth cleaning treatment example performed by the processing unit 507. FIG. 21 is an illustrative view for describing an oxide film forming step (S63) included in the sixth cleaning treatment example.

The sixth cleaning treatment example is different from the fifth cleaning treatment example shown in FIG. 17 in that it performs the oxide film forming step (step S63) where an oxide film is formed on the upper surface (surface) of the substrate W prior to a silylating step (S64). The sixth cleaning treatment example is described referring to FIGS. 20 and 21.

Steps S61, S62 shown in FIG. 20 are respectively the same as steps S41, S42 shown in FIG. 17. Further, steps S64 to S70 shown in FIG. 20 are respectively the same as steps S53 to S59 shown in FIG. 4. Therefore, descriptions of these steps are omitted.

The oxide film forming step (S63) is performed after start of rotation of the substrate W (step S62). The oxide film forming step (S63) is a step of supplying ozone water to the upper surface (surface) of the substrate W. At a time of performing the oxide film forming step (S63), the controller 4 moves the ozone water nozzle 503 from the retreat position to the treatment position by controlling the seventh nozzle moving unit 508. When the ozone water nozzle 503 is disposed above the upper surface center portion of the substrate W, the controller 4 opens the ozone water valve 505 to discharge ozone water from the ozone water nozzle 503 toward the upper surface center portion of the substrate W being rotated, as shown in FIG. 21. Ozone water supplied to the upper surface center portion of the substrate W receives a centrifugal force due to the rotation of the substrate W and moves toward the upper surface outer peripheral portion of the substrate W. Thus, ozone water reaches the entire area of the upper surface of the substrate W, and an oxide film is formed on the entire area of the upper surface of the substrate W.

Further, in the oxide film forming step (S63), the controller 4 may move a supply position of ozone water to the upper surface of the substrate W (for example, between the upper surface center portion and the upper surface outer peripheral portion) by controlling the seventh nozzle moving unit 508.

After a predetermined period has passed from start of the supply of ozone water to the substrate W, the controller 4 closes the ozone water valve 505 to stop the discharge of ozone water from the ozone water nozzle 503. Further, the controller 4 retreats the ozone water nozzle 503 from above the spin chuck 412 by controlling the seventh nozzle moving unit 508. Thereafter, the silylating step (S64) and a first step of raising a substrate to a high temperature (S65) are started.

According to the fifth embodiment, the oxide film forming step (S63) is performed prior to the silylating step (S64). In the oxide film forming step (S63), an oxide film is formed on the surface 41a of the silicon substrate 41 and the surface layers of the films 43, 47, 48, 49, 50.

Silyl groups which the silylation agent has are prone to react with hydroxyl groups (OH groups) included in the oxide film. Therefore, by covering the surface 41a of the silicon substrate 41 and the surface layers of the films 43, 47, 48, 49, 50 with the oxide film prior to the silylating step (S64), silylation (reform) of the surface 41a of the silicon substrate 41 and the surface layers of the films 43, 47, 48, 49, 50 included in the surface of the substrate W can be performed even more favorably in the silylating step, and thus, the loss of the SiGe film 50 along with the cleaning of the surface of the substrate W using SPM can be even more reduced or prevented.

Next, a first experiment with respect to a film loss is described.

Example

A silicon substrate on whose surface an $SiO_2$ film and an SiN film fabricated by a plasma CVD method were formed was used as an sample, and this silicon substrate was subjected to the cleaning treatment according to the above-described first cleaning treatment example using the substrate processing apparatus 1. Additionally, a concentration (containing concentration of HF) of DHF (dilute hydrofluoric acid) used in the experiment was about 0.5 to 0.6% by weight.

Comparative Example

A silicon substrate on whose surface an $SiO_2$ film and an SiN film fabricated by a plasma CVD method were formed was used as an sample, and this silicon substrate was subjected to a cleaning treatment using SC1 using the substrate processing apparatus 1. This cleaning treatment was a treatment where the silylating step (S73) was omitted in the first cleaning treatment example. Additionally, a concentration (containing concentration of HF) of DHF (dilute hydrofluoric acid) used in the experiment was about 0.5 to 0.6% by weight.

Figure 22:
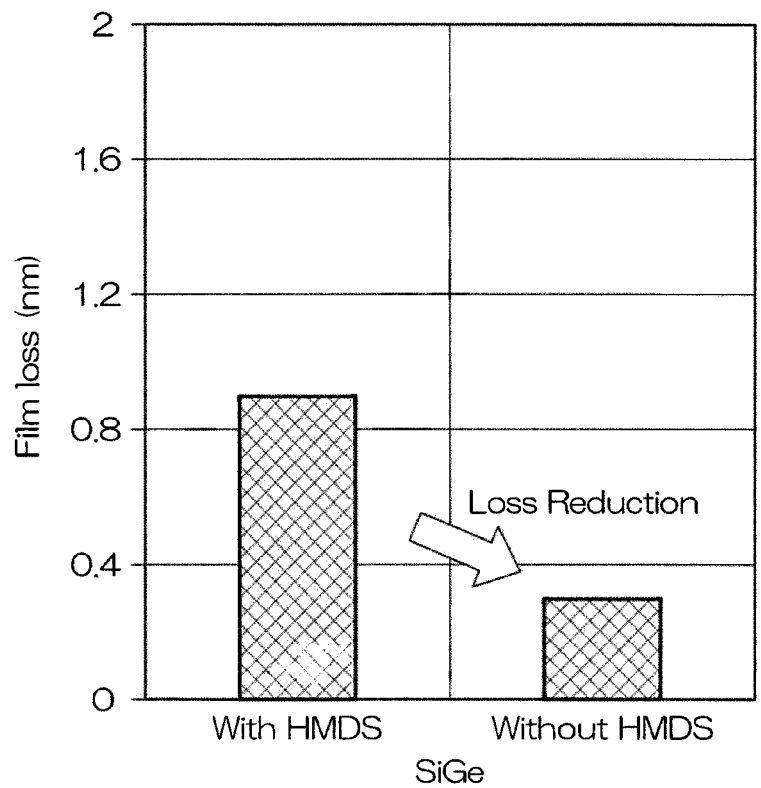
FIG. 22 is a graph showing an experiment result with respect to a film loss when SC1 is used as a cleaning chemical liquid.

In Example and Comparative Example, film reduction of the $SiO_2$ films and the SiN films before and after the cleaning treatments was respectively measured. FIG. 22 shows experimental results of the first experiment.

It is found from FIG. 22 that while in Comparative Example where the silylating step (S3) was not performed, the film reduction of the $SiO_2$ film and the SiN film was large, in Example where the silylating step (S73) was performed prior to the SC1 cleaning step (S4), the respective film reduction of the $SiO_2$ film and the SiN film was small. Therefore, it is found that respective film reduction of an $SiO_2$ film and an SiN film in the silylating step (S3) can be suppressed by performing the silylating step (S3) prior to the SC1 cleaning step (S4).

While the five embodiments of this invention have been described above, this invention can be implemented in further another embodiments.

For example, in the second and third embodiments, as the physical cleaning, the jet flow of minute liquid drops of the processing liquid (the liquid silylation agent or the cleaning chemical liquid) from the two-fluid nozzle 203, 303 is described as one employing a liquid drop discharging cleaning supplied to the surface of the substrate W. However, as the physical cleaning, in place of/along with this, brush cleaning where a surface of a substrate W is cleaned by making a brush such as a scrub brush contact this surface while a processing liquid is supplied to the surface of the substrate W can be performed.

Further, in the fourth and fifth embodiments, as an example of the first step of raising a substrate to a high temperature (S65), the description is made with a resistance-type heater shown as an example for a heat generating member. However, an infrared heater such as a halogen lamp can be employed as a heat generating member other than this. In this case, an approach where the infrared heater is opposed to a surface of a substrate W and infrared is irradiated to the substrate W from above can be employed.

Further, in the fourth and fifth embodiments, a substrate W may be warmed by supplying a high-temperature fluid (high-temperature gas or a high-temperature liquid) to the substrate W, not limited to heating the substrate W using a heat generating member.

Further, in the fifth embodiment, the step of supplying ozone water to a surface of a substrate W (S63) is described as an example of the oxide film forming step. However, as an oxide film forming step, in place of supplying ozone water/along with supplying ozone water, a second step of raising a substrate W to a high temperature may be performed in order to form an oxide film on a surface of the substrate W. In this second step of raising a substrate W to a high temperature, raising the substrate W to a high temperature can be achieved by controlling to a heat generating state the hot plate 413 provided to the processing unit 407, 507 according to the fourth and fifth embodiments. In this second step of raising a substrate W to a high temperature, the substrate W is raised to a second high temperature higher than the first high temperature in the above-described first step of raising a substrate to a high temperature (S65). The second high temperature is a temperature enough to form an oxide film on a surface layer of a fine pattern 40 of an upper surface of the substrate W (for example, about 200° C. to about 300° C.).

Further, when the oxide film forming step is performed by raising a substrate W to a high temperature, this oxide film forming step may be performed in an oxide film forming unit which is a process different from the processing units 407, 507. This oxide film forming unit is provided in the process block 3 (see FIG. 1) of the processing unit 407, 507.

Further, in the first, second and fourth to sixth cleaning treatment examples according to the first, second, fourth and fifth embodiments, a rinsing step of supplying a rinsing liquid to an upper surface of a substrate W to wash away the adhering silylation agent on the upper surface of the substrate W may be provided between the silylating step (S3, S23, S43, S54, S63) and the chemical liquid cleaning step (S4, S24, S44, S55, S64).

Further, in the fourth to sixth cleaning treatment examples according to the fourth and fifth embodiments, the chemical liquid cleaning step (S44, S55, S64) may be performed in parallel with the silylating step (S43, S54, S63), instead of being performed after the silylating step is performed.

Further, in the fourth to sixth cleaning treatment examples according to the fourth and fifth embodiments, a surface of a substrate W may be physically cleaned in parallel with the silylating step (S43, S54, S63) or prior to this silylating step (S43, S54, S63).

Further, in the first to third cleaning treatment examples according to the first to third embodiments, a substrate W may be heated by a hot plate (the same as the hot plate 413 shown in FIG. 15 and the like), a heater (for example, an infrared heater) or the like in parallel with the silylating step (S3, S23, S33).

Further, in the fourth to sixth cleaning treatment examples according to the fourth and fifth embodiments, the silylating step (S43, S54, S63) may be performed without heating a substrate W.

Further, in the first to third cleaning treatment examples according to the first to third embodiments, an oxide film may be formed on a surface of a substrate W prior to the silylating step (S3, S23, S33, S73).

Further, in the above-described first to fifth embodiments, at least one of the SC1 nozzle 24, the rinsing liquid nozzle 29, the silylation agent nozzle 34, the first two-fluid nozzle 203, the second two-fluid nozzle 303, the SMP nozzle 403, the ozone water nozzle 503 and a dilute hydrofluoric acid nozzle 603 may be a fixed nozzle discharging the cleaning chemical liquid, the rinsing liquid and the liquid silylation agent with the discharging port fixed.

Further, in the above-described first, second and fourth embodiments, upper and lower surfaces of a substrate W may be cleaned by supplying the cleaning chemical liquid also to the lower surface of the substrate W along with supplying the cleaning chemical liquid to the upper surface of the substrate W.

Further, in the first to sixth cleaning treatment examples according to the first to fifth embodiments, a gaseous silylation agent may be supplied to a surface of a substrate W instead of a silylation liquid (liquid silylation agent) in the silylating step (S3, S23, S33, S43, S53, S63).

Further, while the fourth to sixth cleaning treatment examples according to the fourth and fifth embodiments are described as treatments for removing a resist pattern from a substrate W after the ion implantation treatment at a high dose, the fourth to sixth cleaning treatment examples may be treatments for removing a resist residue from a surface of a substrate Wafter an ashing treatment.

Further, in the first to third cleaning treatment examples according to the first to third embodiments, there may be a case that a natural oxide film is formed on a surface of a fine pattern 40 of a substrate W after the SC1 cleaning step (S4, S14, S23). Therefore, in order to remove this natural oxide film, a dilute hydrofluoric acid (HF) and the like may be supplied to the surface of the substrate W after the SC1 cleaning step (S4, S14, S23) to remove the natural oxide film from the surface of the fine pattern 40. Since a natural oxide film has a low coupling force compared to an oxide film formed as a pattern such as a mask, it can be removed favorably from a substrate W.

Further, in the above-described respective embodiments, while SPM is illustrated as an acid cleaning chemical liquid, SC2 (a mixed liquid containing HCl and $H_2O_2$), buffered hydrofluoric acid (Buffered HF: a mixed liquid containing HF and ammonium fluoride) and the like may be used as an acid cleaning chemical liquid other than SPM.

Further, in the above-described respective embodiments, while an acid cleaning chemical liquid and an alkaline cleaning chemical liquid are illustrated as a cleaning chemical liquid, an organic solvent such as isopropyl alcohol (IPA) and the like may be used as a cleaning chemical liquid. Methanol, ethanol, HFE (hydro-fluoro-ether), acetone and Trans-1,2-dichloroethylene can be illustrated as an organic solvent other than IPA. Further, while the substrate W shown in FIG. 3 is shown as an example of a substrate to be processed, it goes without saying that a substrate to be processed is not limited to the substrate W.

While the case where the pattern 40 includes the SiN film 49 and the $SiO_2$ films 43, 46, 48 is illustrated, for example, a pattern formed on a surface of a substrate W may include at least one of an SiN film, an $SiO_2$ film, an SiGe film and an SiCN film. Further, an SiN film is not limited to one fabricated by a plasma CVD method but may be an SiN film which is fabricated by other approach (a PVD method or other CVD method).

Further, a silylation agent supplied to a surface of a substrate W may be a vapor, not a liquid.

Further, while HMDS and TMS are illustrated as a silylation agent supplied to a surface of a substrate W, TMSI (N-Trimethylsilyimidazole), BSTFA (N,O-bis [Trimethylsilyl] trifuluoroacetamide), BSA (N,O-bis [Trimethylsilyl] acetamide), MSTFA (N-Methyl-N-trimethylsilyl-trifluoacetamide), TMSDMA (N-Trimethylsilyl dimethylamine), TMSDEA (N-Trimethylsilyl diethylamine), MTMSA (N,O-bis (Trimethylsilyl) trifuluoroacetamide), TMCS (with base) (Trimethylchlorosilane), HMDS (Hexamethyldisilazane), an amine having a hydrophobic group, an organic silicon compound, TMS (tetramethylsilane), fluorinated alkyl chlorosilane, alkyl disilazane, dimethylsilyl dimethylamine, dimethylsilyl diethylamine, bis(dimethylamino)dimethylsilane, and organosilane compound can be used as an silylation agent other than HMD and TMS.

While the embodiments of the present invention are described in detail, these are only specific examples used for clarifying technical contents of the present invention, and the present invention should not be construed as being limited to these specific examples, but is only limited by the scope of the appended claims.

This application corresponds to Japanese Patent Application No. 2015-21525 filed in Japan Patent Office on Feb. 5, 2015, the entire disclosure of which is incorporated herein by reference.

LIST OF REFERENCE NUMERALS 1 substrate processing apparatus
4 controller
13 SC1 supplying unit (cleaning chemical liquid supplying unit)
15 first silylation agent supplying unit (silylation agent supplying unit)
40 pattern (fine pattern)
43 first $SiO_2$ film
48 third $SiO_2$ film
49 SiN film
50 SiGe film
201 substrate processing apparatus
202 second silylation agent supplying unit (silylation agent supplying unit)
301 substrate processing apparatus
302 silylation agent & SC1 supplying unit (silylation agent supplying unit, cleaning chemical liquid supplying unit)
401 substrate processing apparatus
402 SPM supplying unit (cleaning chemical liquid supplying unit)
501 substrate processing apparatus
W substrate

What is claimed is:

1. A substrate processing method of performing a cleaning treatment to a substrate having a fine pattern including a SiGe film on a surface of the substrate, including:
   an oxide film forming step of forming an oxide film on the surface of the SiGe film by supplying an ozone water on the SiGe film;
   a silylating step of forming a silylation film on the oxide film by supplying a silylation agent to the surface of the oxide film; and
   a chemical liquid cleaning step of cleaning the surface of the substrate by supplying a cleaning chemical liquid to the surface of the substrate in parallel with the silylating step, thereby forming said silylation film covering said SiGe film in parallel with the chemical liquid cleaning step.

2. A substrate processing method according to claim 1, wherein the silylating step includes a step of supplying a liquid silylation agent to the surface of the substrate.

3. A substrate processing method according to claim 1, further including a physical cleaning step of physically cleaning the surface of the substrate in parallel with the silylating step or prior to the silylating step.

4. A substrate processing method according to claim 1, further including a substrate heating step of heating the substrate in parallel with the silylating step.

5. A substrate processing method according to claim 1, wherein the cleaning chemical liquid is an ammonia-hydrogen peroxide mixture.

6. A substrate processing method according to claim 1, wherein the cleaning chemical liquid is a sulfuric acid/hydrogen peroxide mixture.

7. A substrate processing method according to claim 1, wherein the fine pattern includes an SiN film fabricated by a plasma CVD method.

8. A substrate processing method of performing a cleaning treatment to a substrate having a fine pattern including a SiGe film on a surface of the substrate, including:
- a silylating step of forming a silylation film on the SiGe film by supplying a silylation agent to the surface of the SiGe film; and
- an ammonia-hydrogen peroxide mixture cleaning step of cleaning the surface of the substrate by supplying an ammonia-hydrogen peroxide mixture to the surface of the substrate in parallel with the silylating step, thereby forming said silylation film covering said SiGe film in parallel with said ammonia-hydrogen peroxide mixture cleaning step.

9. A substrate processing method according to claim 8, wherein the silylating step and the ammonia-hydrogen peroxide mixture cleaning step include a step of supplying a jet flow of the liquid drops of a containing liquid containing silylating agent and the ammonia-hydrogen peroxide mixture, which is formed by mixing the containing liquid and a gas, to the surface of the SiGe film.

* * * * *